(12) United States Patent
Choi et al.

(10) Patent No.: US 11,800,708 B2
(45) Date of Patent: Oct. 24, 2023

(54) NONVOLATILE MEMORY DEVICE AND METHOD FOR FABRICATING THE SAME

(71) Applicant: Samsung Electronics Co., Ltd., Suwon-si (KR)

(72) Inventors: Yoo Jin Choi, Suwon-si (KR); Jung-Hwan Lee, Seoul (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 369 days.

(21) Appl. No.: 16/995,057

(22) Filed: Aug. 17, 2020

(65) Prior Publication Data

US 2021/0210505 A1  Jul. 8, 2021

(30) Foreign Application Priority Data

Jan. 7, 2020 (KR) .................. 10-2020-0001822

(51) Int. Cl.
| | |
|---|---|
| *H10B 41/10* | (2023.01) |
| *H10B 43/10* | (2023.01) |
| *H10B 43/27* | (2023.01) |
| *H10B 41/27* | (2023.01) |
| *H10B 41/40* | (2023.01) |
| *H10B 43/40* | (2023.01) |

(52) U.S. Cl.
CPC ............ *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ................ H01L 27/11551–11556; H01L 27/11578–11582
See application file for complete search history.

(56) References Cited

U.S. PATENT DOCUMENTS

| | | | |
|---|---|---|---|
| 9,425,208 B2 | 8/2016 | Kim et al. | |
| 9,564,451 B1 | 2/2017 | Shin et al. | |
| 9,691,782 B1* | 6/2017 | Hwang | H01L 27/11573 |
| 10,109,644 B2 | 10/2018 | Shin et al. | |
| 10,276,591 B2 | 4/2019 | Lee et al. | |
| 10,312,191 B2 | 6/2019 | Jung et al. | |
| 2015/0249093 A1* | 9/2015 | Lee | H01L 27/11582 257/324 |
| 2017/0162594 A1* | 6/2017 | Ahn | H01L 21/31 |
| 2017/0294388 A1 | 10/2017 | Yoon et al. | |
| 2018/0026047 A1 | 1/2018 | Park et al. | |
| 2021/0126009 A1* | 4/2021 | Luo | H01L 27/11524 |

* cited by examiner

*Primary Examiner* — Eric A. Ward
(74) *Attorney, Agent, or Firm* — Harness, Dickey & Pierce, P.L.C.

(57) ABSTRACT

A nonvolatile memory device and method for fabricating the same are provided. The nonvolatile memory device comprising: a substrate; a mold structure including a first insulating pattern and a plurality of gate electrodes alternately stacked in a first direction on the substrate; and a word line cut region which extends in a second direction different from the first direction and cuts the mold structure, wherein the word line cut region includes a common source line, and the common source line includes a second insulating pattern extending in the second direction, and a conductive pattern extending in the second direction and being in contact with the second insulating pattern and a cross-section in the second direction.

18 Claims, 28 Drawing Sheets

NONVOLATILE MEMORY DEVICE AND METHOD FOR FABRICATING THE SAME

This application claims priority to Korean Patent Application No. 10-2020-0001822, filed on Jan. 7, 2020, and all the benefits accruing therefrom under 35 U.S.C. § 119, the disclosure of which is incorporated herein by reference in its entirety.

BACKGROUND

1. Field of the Invention

The present inventive concepts relate to a nonvolatile memory device and a method for fabricating the same.

2. Explanation of the Related Art

Semiconductor memory devices may be broadly classified into a volatile memory device and a nonvolatile memory device. The degree of integration of nonvolatile memory device increases in order to satisfy the increased performance and/or lower price required by consumers. Incidentally, in the case of a two-dimensional or planar memory device, the degree of integration is determined by an area occupied by unit memory cells. Therefore, recently, a three-dimensional memory device in which unit memory cells are vertically placed has been developed.

SUMMARY

Aspects of the present inventive concepts provide a nonvolatile memory device with improved product reliability.

Aspects of the present inventive concepts also provide a method for fabricating a nonvolatile memory device capable of fabricating a nonvolatile memory device with improved product reliability.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

According to an aspect of the present inventive concepts, there is provided a nonvolatile memory device comprising: a substrate; a mold structure including a first insulating pattern and a plurality of gate electrodes alternately stacked in a first direction on the substrate; and a word line cut region which extends in a second direction different from the first direction and cuts the mold structure, wherein the word line cut region includes a common source line, and the common source line includes a second insulating pattern extending in the second direction, and a conductive pattern extending in the second direction and being in contact with the second insulating pattern and a cross-section in the second direction.

According to an aspect of the present inventive concepts, there is provided a nonvolatile memory device comprising: a substrate; a mold structure including a first insulating pattern and a plurality of gate electrodes alternately stacked on the substrate in a first direction; a plurality of channel structures penetrating the mold structure; a plurality of pad electrodes which is electrically connected to the plurality of channel structures to provide a voltage; and a plurality of word line cut regions which extends in a second direction different from the first direction and cuts the mold structure, wherein each of the plurality of word line cut regions includes a common source line, each of the common source lines includes a second insulating pattern extending in the second direction, and a conductive pattern extending in the second direction and being in contact with the second insulating pattern and a cross-section in the second direction, and a lowermost part in the first direction of at least one of the common source lines is spaced apart from a gate electrode stacked at a lowermost part in the first direction of the plurality of gate electrodes in the first direction.

According to an aspect of the present inventive concepts, there is provided a nonvolatile memory device comprising: a substrate; a mold structure including a first insulating pattern and a plurality of gate electrodes alternately stacked on the substrate in a first direction; a plurality of channel structures penetrating the mold structure, each of the plurality of channel structures including, at a lowermost stage, a first semiconductor pattern, an information storage film for exposing the first semiconductor pattern, a second semiconductor pattern formed along the information storage film and the first semiconductor pattern, a filling pattern in the second semiconductor pattern, and a channel pad on the information storage film, the second semiconductor pattern, and the filling pattern; a word line cut region which extends along a second direction different from the first direction and cuts the mold structure, the word line cut region including a common source line spacer which is along a sidewall of the word line cut region and exposes the substrate, and a common source line inside the common source line spacer, the common source line including a second insulating pattern extending in the second direction, and a conductive pattern extending in the second direction and being in contact with the second insulating pattern and a cross-section in the second direction; a first interlayer insulating film which is on the mold structure and surrounds at least some of the plurality of channel structures and at least a part of the word line cut region; a bit line contact on the channel pad; a second interlayer insulating film which surrounds the bit line contact; and a bit line on the second interlayer insulating film and electrically connected to the bit line contact.

According to an aspect of the present inventive concepts, there is provided a method for fabricating a nonvolatile memory device, the method comprising: forming a substrate; alternately stacking a first insulating pattern and a plurality of gate electrodes on the substrate in a first direction to form a mold structure; forming a plurality of channel structures penetrating the mold structure; cutting the mold structure to isolate the plurality of channel structures in a second direction intersecting the first direction, and forming a word line cut region extending in a third direction intersecting the first direction and the second direction; forming a common source line spacer along sidewall of the word line cut region; filling inside of the common source line spacer with an insulating material; forming a passivation layer on the insulating material; removing some regions of the insulating material and the passivation layer to expose the common source line spacer to the some regions; forming a conductive material on the exposed common source line spacer and non-removed regions of the passivation layer; removing the conductive material from regions, except the conductive material in the word line cut region; removing the passivation layer; and removing remaining insulating material except the insulating material in the word line cut region to form a common source line.

BRIEF DESCRIPTION OF THE DRAWINGS

The above and other aspects and features of the present inventive concepts will become more apparent by describing in detail example embodiments thereof with reference to the attached drawings, in which.

DETAILED EXPLANATION OF EMBODIMENTS

Figure 1:
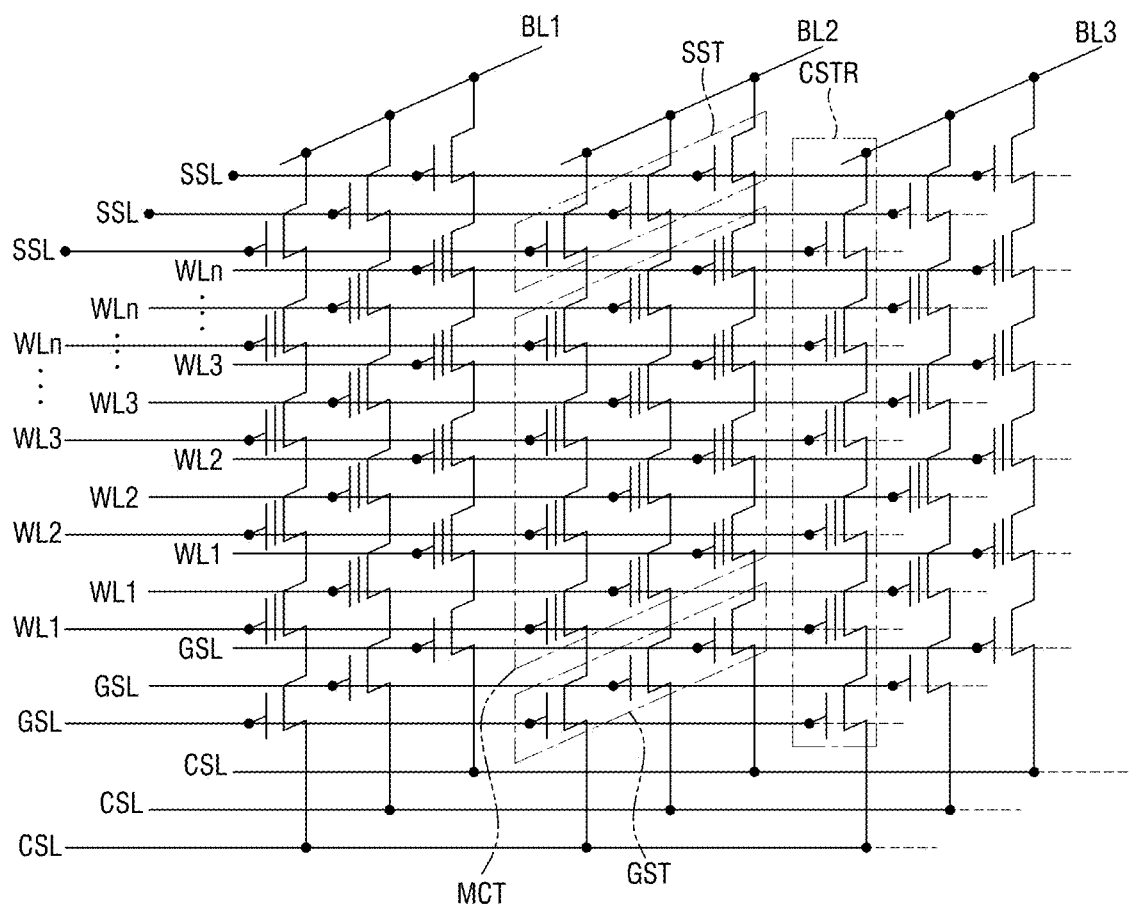
FIG. 1 is an example circuit diagram for explaining a nonvolatile memory device according to some embodiments.
Figure 1:
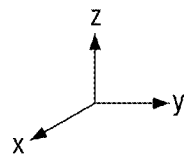

FIG. 1 is an example circuit diagram for explaining a nonvolatile memory device according to some embodiments.

Referring to FIG. 1, a memory cell array of a nonvolatile memory device according to some embodiments may include a common source line CSL, a plurality of bit lines BL, and/or a plurality of cell strings CSTR.

The plurality of bit lines BL1 to BL3 may be two-dimensionally arranged. For example, the bit lines BL1 to BL3 may be spaced apart from each other and extend in a first direction X. A plurality of cell strings CSTR may be connected to each bit line BL in parallel. The cell strings CSTR may be commonly connected to the common source line CSL. That is, the plurality of cell strings CSTR may be placed between the bit lines BL and the common source lines CSL. In some embodiments, the plurality of common source lines CSL may be arranged two-dimensionally. For example, the common source lines CSL may be spaced apart from each other and extend in a second direction Y, respectively. The same voltage may be electrically applied to the common source lines CSL, or different voltages may be applied to the common source lines CSL, and the common source lines CSL may be controlled separately.

Each cell string CSTR may include a ground selection transistor GST connected to the common source line CSL, a string selection transistor SST connected to each of a plurality of bit lines BL1 to BL3, and a plurality of memory cell transistors MCT placed between the ground selection transistor GST and the string selection transistor SST. Each memory cell transistor MCT may include a data storage element. The ground selection transistors GST, the string selection transistors SST and the memory cell transistors MCT may be connected to each other in series. The common source line CSL may be commonly connected to the sources of the ground selection transistors GST. A plurality of gate electrodes (e.g., a ground selection line GSL, a plurality of word lines WL1 to WLn, and a string selection line SSL) may be placed between the common source line CSL and each of the bit lines BL1 to BL3. The ground selection line GSL may be used as a gate electrode of the ground select transistor GST, the plurality of word lines WL1 to WLn may be used as a gate electrode of the memory cell transistor MCT, and the string selection line SSL may be used as ae gate electrode of the string selection transistor SST.

Figure 2:
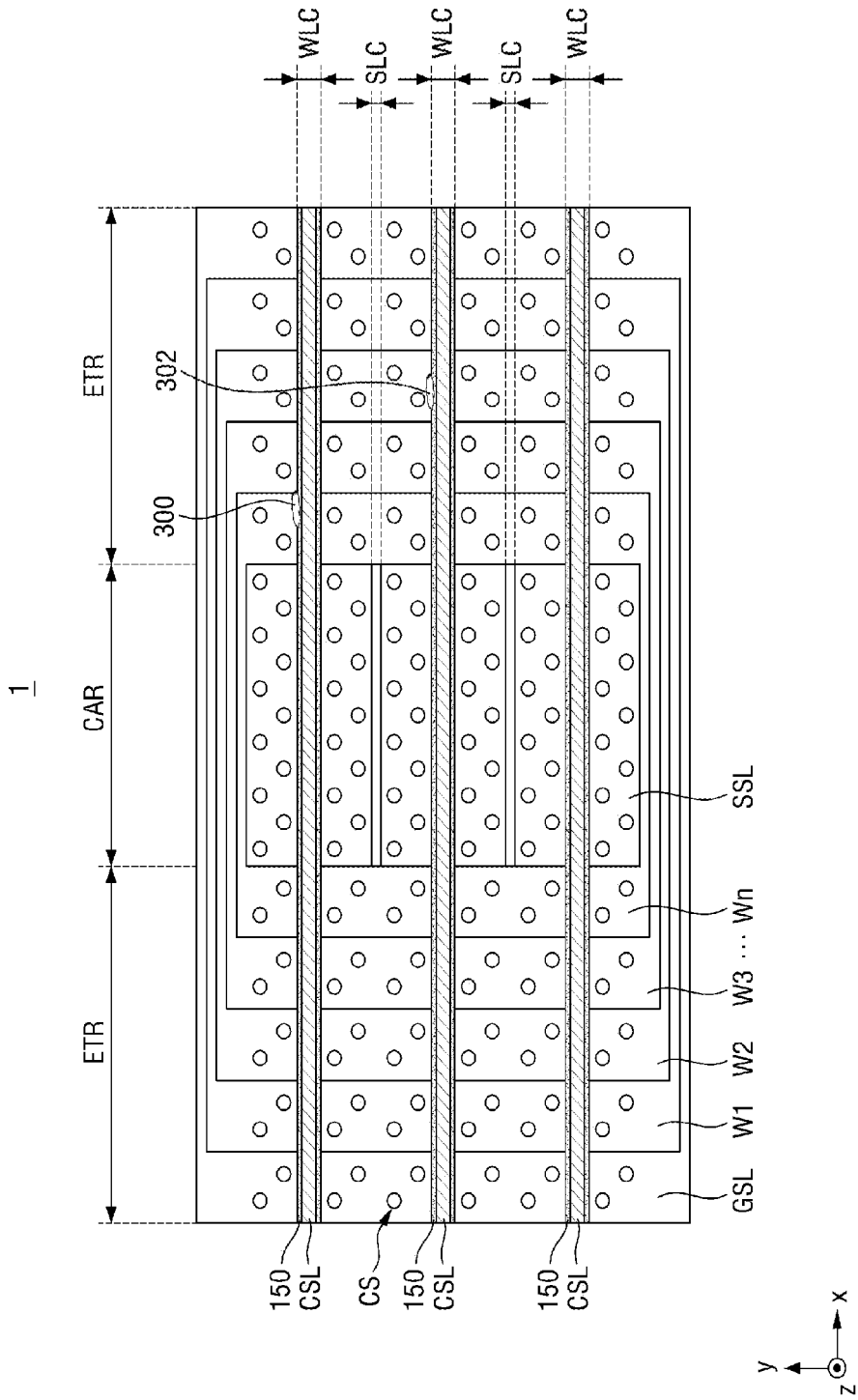
FIG. 2 is an example layout diagram for explaining a nonvolatile memory device.

FIG. 2 is an example layout diagram for explaining a nonvolatile memory device.

Referring to FIG. 2, the nonvolatile memory device 1 may include a cell array region CAR and/or an extension region ETR.

A memory cell array including a plurality of memory cells may be formed in the cell array region CAR. The memory cell array may include a plurality of memory cells, a plurality of word lines WL1 to WLn electrically connected to the respective memory cells, and a plurality of bit lines (not shown). For example, a mold structure, a plurality of channel structures CS and/or a bit line 140 which will be explained below may be formed in the cell array region CAR.

The extension region ETR may be placed around the cell array region CAR. At least some of each of a plurality of gate electrodes (e.g., the ground selection line GSL, the plurality of word lines WL1 to WLn and the string selection line SSL), a mold structure explained later, and a plurality of channel structures CS may be stacked stepwise in the extension region ETR. Also, a plurality of pad electrodes (not shown) connected to a plurality of gate electrodes (e.g., the ground selection line GSL, the plurality of word lines WL1 to WLn and the string selection line SSL) may be formed in the extension region ETR. For example, some of the plurality of pad electrodes (not shown) may be electrically connected to some of the plurality of pad electrodes formed in a page buffer 530 of FIG. 27.

A plurality of channel structures CS or a plurality of gate electrodes (e.g., the ground selection line GSL, the plurality of word lines WL1 to WLn or the string selection line SSL) in the nonvolatile memory device 1 may be separated by a word line cut region WLC. That is, the word line cut region WLC extends in the second direction Y intersecting the bit line (not shown), and may cut a mold structure MS to be explained in FIG. 4. A common source line spacer 150 may be formed along a sidewall in the word line cut region WLC. The common source line spacer 150 may be made of silicon oxide, silicon nitride or silicon oxynitride. In addition, the inside of the word line cut region WLC and the inside of the common source line spacer 150 may be filled with a conductive material to form a common source line CSL on which a conductive pattern is formed. The conductive material may be made of, but is not limited to, a metal material such as tungsten (W), aluminum (Al) or copper (Cu). Some (e.g., the string selection line SSL) of the plurality of gate electrodes (e.g., the ground selection line GSL, the plurality of word lines WL1 to WLn or the string selection line SSL) of the nonvolatile memory device 1 may be cut in a third direction Z to form a string selection line cut region SLC. The string selection line cut region SLC may be filled with an insulating film (not shown).

At this time, defects 300 and 302 may occur in the extension region ETR in which at least some of a plurality of gate electrodes (e.g., the ground selection line GSL, the plurality of word lines WL1 to WLn or the string selection line SSL) or a mold structure to be explained later are stacked stepwise.

For example, current or charge leakage may occur between the common source line CSL formed by the conductive pattern and the plurality of gate electrodes (e.g., the ground selection line GSL, the plurality of word lines WL1 to WLn or the string selection line SSL) of the extension region ETR. For example, a defect 300 may occur due to an occurrence of an electrical leakage between the common source line CSL and an $n^{th}$ word line WLn in the extension region ETR. Alternatively, for example, a defect 302 may occur due to an occurrence of electrical leakage between the common source line CSL and a second word line WL2 in the extension region ETR. The common source line CSL in the extension region ETR is not formed by a conductive pattern, but may be formed by an insulating pattern that does not conduct electricity, thereby eliminating defects (e.g., 300 and 302) between the common source line CSL and at least some of the plurality of gate electrodes (e.g., the ground selection line GSL, the plurality of word lines WL1 to WLn or the string selection string SSL) in the extension region ETR.

Figure 3:
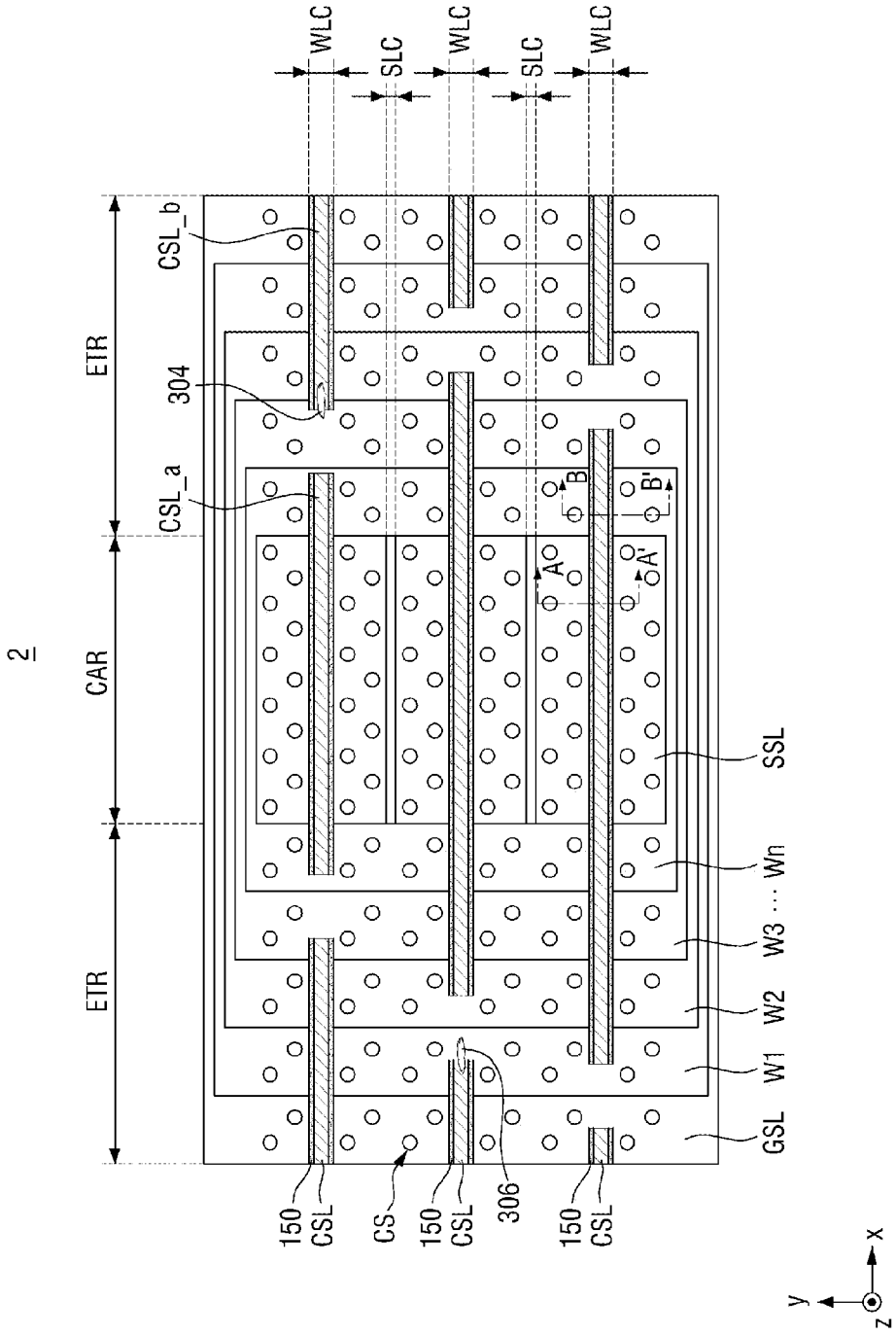
FIG. 3 is an example layout diagram for explaining a nonvolatile memory device.

FIG. 3 shows another example in which a current or charge leakage may occur between the common source line CSL formed by the conductive pattern and the plurality of gate electrodes (e.g., the ground selection lines GSL, the plurality of word lines WL1 to WLn or the string selection line SSL) of the extension region ETR.

FIG. 3 is an example layout diagram for explaining a nonvolatile memory device. For reference, repeated contents of explanation of FIG. 2 will be omitted, and differences from FIG. 2 will be mainly explained.

Referring to FIG. 3, unlike FIG. 2, the nonvolatile memory device may have an H-CUT shape in which a cut region of the common source line CSL is formed in the extension region ETR of the nonvolatile memory device 2a.

More specifically, a part of the common source line CSL may be cut to form a first sub-common source line CSL and a second sub-common source line CSL. That is, the first sub-common source line CSL and the second sub-common source line CSL may be placed apart from each other in the first direction X. Therefore, some of the plurality of gate electrodes (e.g., the ground selection line GSL, the plurality of word lines WL1 to WLn or the string selection line SSL) around the first sub-common source line CSL and the second sub-common source line CSL may have an H shape. Some of the plurality of gate electrodes (e.g., the ground selection line GSL, the plurality of word lines WL1 to WLn or the string selection line SSL) may be electrically connected to each other through a spaced region between the first sub-common source line CSL and the second sub-common source line CSL.

As in FIG. 2, defects 304 and 306 may occur within the extension region ETR stacked stepwise, between the common source line CSL and at least some of the plurality of gate electrodes (e.g., the ground selection line GSL, the plurality of word lines WL1 to WLn or the string selection line SSL) or a mold structure to be explained blow. For example, current or charge leakage may occur between the common source line CSL formed by the conductive pattern and the plurality of gate electrodes (e.g., the ground selection line GSL, the plurality of word lines WL1 to WLn or the string selection line SSL) of the extension region ETR. For example, a defect 304 may occur due to an occurrence of an electrical leakage between the common source line CSL and an $n^{th}$ word line WLn in the extension region ETR. At this time, although a defect occurs on the sidewall of the common source line CSL in FIG. 2, a defect 304 may occur in an extending direction of the common source line CSL, that is, in the first direction X in FIG. 3. Alternatively, for example, a defect 306 may occur due to an occurrence of electrical leakage between the common source line CSL and a second word line WL2 in the extension region ETR. At this time, similarly, unlike FIG. 2, a defect 306 may occur in the extending direction of the common source line CSL, that is, in the first direction X in FIG. 3.

The common source line CSL in the extension region ETR is not formed by a conductive pattern, but may be formed with by insulating pattern that does not conduct electricity, thereby eliminating the defects (e.g., 304 and 306) between the common source line CSL and at least some of the plurality of gate electrodes (e.g., the ground selection line GSL, the plurality of word lines WL1 to WLn or the string selection line SSL) in the extension region ETR. The defect in the extension region ETR will be explained through FIGS. 4 and 5, by comparing a cross-section in the cell array region CAR and a cross-section in the extension region ETR of the nonvolatile memory device 2. Although the cross-sections of FIGS. 4 and 5 will be explained by taking the cross-section of the nonvolatile memory device 2 of FIG. 3 as an example, the cross sections of FIGS. 4 and 5 are not limited thereto, and may also be explained by, for example, the cross-section of the memory device 1 of FIG. 2.

Figure 4:
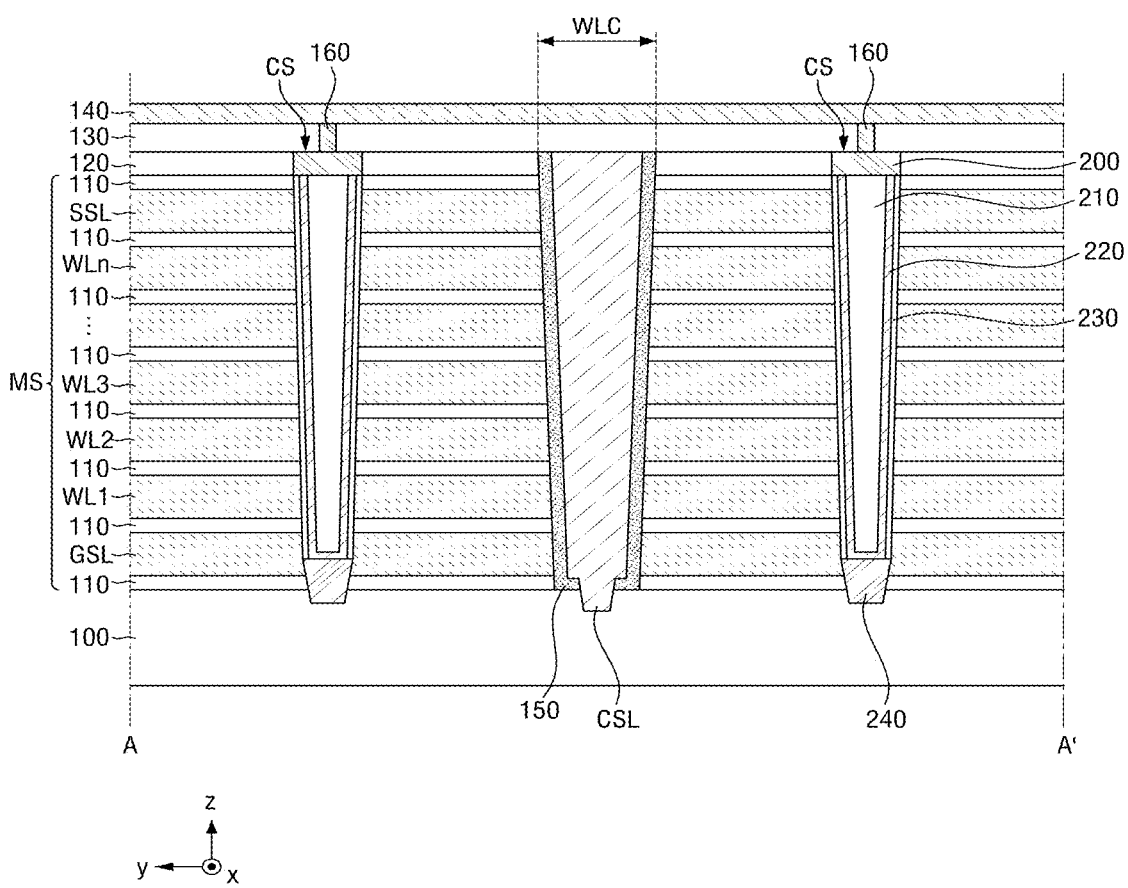
FIG. 4 is a cross-sectional view taken along a line A-A' of FIG. 3.
Figure 5:
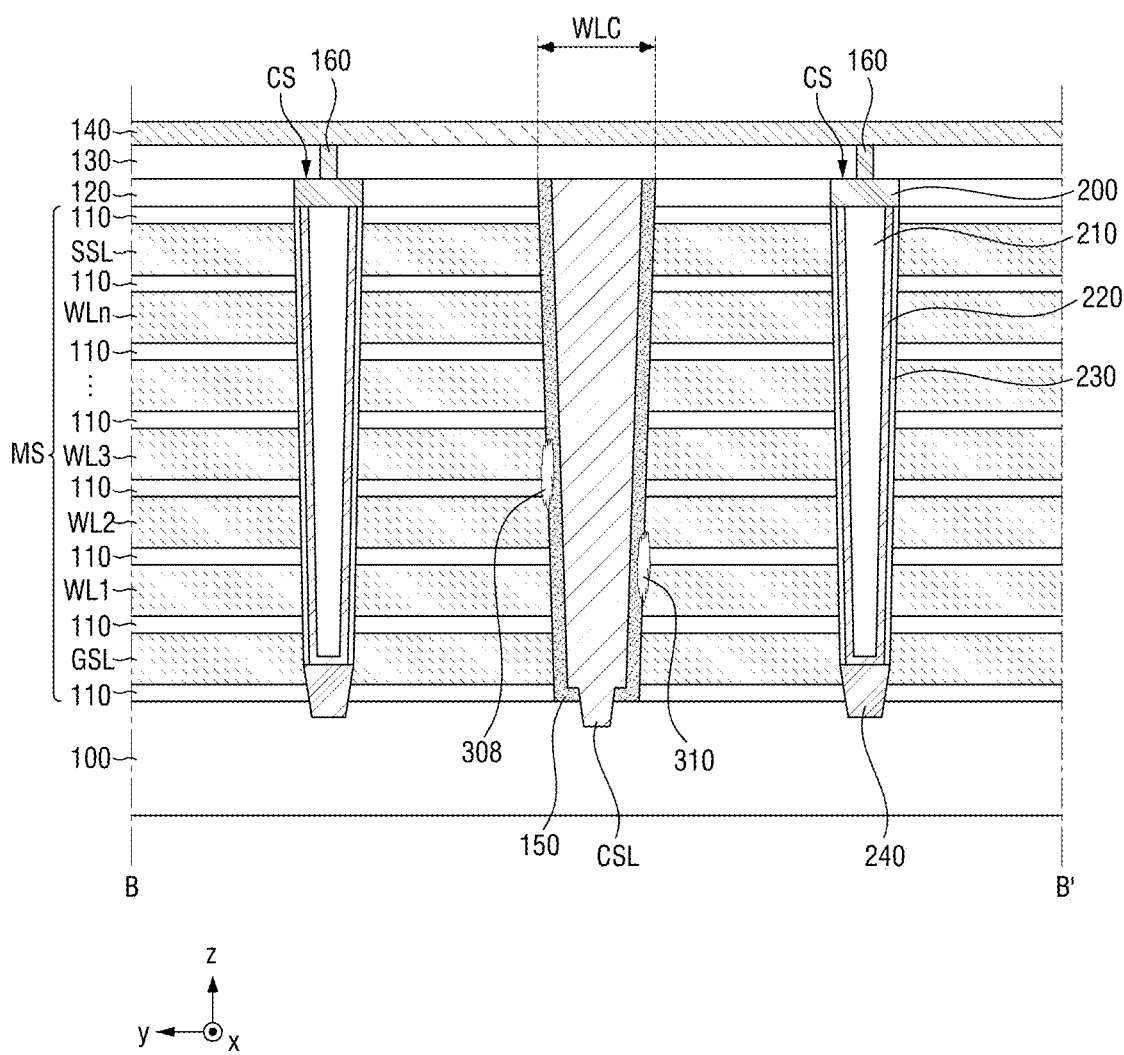
FIG. 5 is a cross-sectional view taken along a line B-B' of FIG. 3.

FIG. 4 is a cross-sectional view taken along a line A-A' of FIG. 3.

A cross-section of the cell array region CAR of the nonvolatile memory device 2 will be examined referring to FIGS. 3 and 4. The nonvolatile memory device 2 includes a substrate 100, a mold structure MS, a plurality of channel structures CS, a bit line 140, and/or a common source line CSL.

The substrate 100 may include, for example, a semiconductor substrate such as a silicon substrate, a germanium substrate or a silicon-germanium substrate. Alternatively, the substrate 100 may include a silicon-on-insulator (SOI) substrate, a germanium-on-insulator (GOI) substrate or the like. The mold structure MS may be formed on the substrate 100. The mold structure MS may include a first insulating pattern 110 and a plurality of gate electrodes (e.g., the ground selection line GSL, the plurality of word lines WL1 to WLn or the string selection line SSL) alternately stacked on the substrate 100 in the third direction Z. For example, each of the first insulating pattern 110 and the plurality of gate electrodes (e.g., the ground selection line GSL, the plurality of word lines WL1 to WLn or the string selection line SSL) may have a layered structure extending in the second direction Y and the first direction X.

The plurality of gate electrodes (e.g., the ground selection line GSL, the plurality of word lines WL1 to WLn or the string selection line SSL) may include the ground selection line GSL, the plurality of word lines WL1 to WLn and the string selection line SSL sequentially stacked on the substrate 100. The ground selection line GSL may be a gate electrode placed in a lowermost part in the third direction Z of a plurality of gate electrodes (e.g., the ground selection line GSL, the plurality of word lines WL1 to WLn or the string selection line SSL). The string selection line SSL may be a gate electrode placed on an uppermost part in the third direction of the plurality of gate electrodes (e.g., the ground selection line GSL, the plurality of word lines WL1 to WLn or the string selection line SSL). The plurality of gate electrodes (e.g., the ground selection line GSL, the plurality of word lines WL1 to WLn or the string selection line SSL) may include a conductive material. For example, although the plurality of gate electrodes (e.g., the ground selection line GSL, the plurality of word lines WL1 to WLn or the string selection line SSL) may include, but is not limited to, metals such as tungsten (W), cobalt (Co) and nickel (Ni), and semiconductor materials such as silicon. The first insulating pattern 110 may include an insulating material. For example, the first insulating pattern 110 may include, but is not limited to, silicon oxide.

The plurality of channel structures CS may penetrate the mold structure MS. In addition, the plurality of channel structures CS may extend in a direction which intersects the plurality of gate electrodes (e.g., the ground selection lines GSL, the plurality of word lines WL1 to WLn or the string selection line SSL). For example, each channel structure CS may have a pillar shape (e.g., a cylinder shape) extending in the third direction Z. Each channel structure CS may include a first semiconductor pattern 220 and an information storage film 230. The first semiconductor pattern 220 may penetrate the mold structure MS. For example, the first semiconductor pattern 220 may extend in the third direction Z. Although the first semiconductor pattern 220 is shown to have a cup shape, this is merely an example. For example, the first semiconductor pattern 220 may have various shapes such as a cylindrical shape, a quadrangular barrel shape, and a solid filler shape. The first semiconductor pattern 220 may include, for example, but is not limited to, semiconductor materials such as single crystal silicon, polycrystalline silicon, organic semiconductor material, and carbon nanostructures.

The information storage film 230 may be interposed between the first semiconductor pattern 220 and each of the plurality of gate electrodes (e.g., the ground selection line GSL, the plurality of word lines WL1 to WLn or the string selection line SSL). For example, the information storage film 230 may extend along a side surface of the first semiconductor pattern 220. The information storage film 230 may include, for example, at least one of silicon oxide, silicon nitride, silicon oxynitride, and a high dielectric constant material having a higher dielectric constant than silicon oxide. Although it is not shown, the information storage film 230 may include a plurality of films. For example, the information storage film 230 may include a tunnel insulating film, a charge storage film, and/or a blocking insulating film sequentially stacked on the first semiconductor pattern 220.

The tunnel insulating film may include, for example, silicon oxide or a high dielectric constant material having a higher dielectric constant than silicon oxide (e.g., aluminum oxide ($Al_2O_3$), and hafnium oxide ($HfO_2$)). The charge storage film may include, for example, silicon nitride. The blocking insulating film may include, for example, silicon oxide or a high dielectric constant material having a higher dielectric constant than silicon oxide (e.g., aluminum oxide ($Al_2O_3$) and hafnium oxide ($HfO_2$)). Each channel structure CS may further include a filling pattern 210. The filling pattern 210 may be formed to fill the inside of the first semiconductor pattern 220 having a cup shape. For example, the first semiconductor pattern 220 may extend along side surfaces and the bottom surface of the filling pattern 210. The filling pattern 210 may include, for example, but is not limited to, silicon oxide. Each channel structure CS may further include a channel pad 200 at the uppermost part of the channel structure CS in the third direction Z. The channel pad 200 may be formed to be connected to an upper part of the first semiconductor pattern 220. For example, the channel pad 200 may be formed in a first interlayer insulating film 120 formed on the mold structure MS.

Although the channel pad 200 is shown to be formed on the upper surface of the first semiconductor pattern 220 in FIG. 4, this is merely an example. For example, the upper part of the first semiconductor pattern 220 may be formed to extend along a side surface of the channel pad 200. The channel pad 200 may include, for example, but not limited to, doped polysilicon.

The plurality of channel structures CS may be arranged in a zigzag form. That is, they may be arranged to intersect each other in the first direction X and the second direction Y. The plurality of channel structures CS arranged in a zigzag pattern may improve the integration of the nonvolatile memory device.

Each of the plurality of channel structures CS may include a second semiconductor pattern 240 directly connected to the substrate 100. The second semiconductor pattern 240 may be placed at the lowermost part of the first semiconductor pattern 220 in the third direction Z. The second semiconductor pattern 240 may be an epitaxial layer that is grown from the substrate 100 using a selective epitaxial growth (SEG) process. That is, the first semiconductor pattern 220 may be electrically connected to the substrate 100 through the second semiconductor pattern 240. The width of the channel structure CS passing through the mold structure MS may decrease toward the upper surface of the substrate 100. This may be attributed to the characteristics of the etching process for forming the mold structure MS.

Subsequently, the plurality of bit lines 140 may extend side by side to be spaced apart from each other. For example, each bit line 140 may extend in the second direction Y. Each bit line 140 may be electrically connected to a plurality of channel structures CS. For example, the bit line 140 may be electrically connected to the plurality of channel structures CS through the bit line contact 160. The bit line contact 160 may penetrate, for example, the second interlayer insulating film 130 to electrically connect the bit line 140 and each of the plurality of channel structures CS.

The first interlayer insulating film 120 and the second interlayer insulating film 130 mentioned above may be made up of, but are not limited to, a high density plasma (HDP) oxide film, TEOS (TetraEthylOrthoSilicate) or a combination thereof. Further, the first interlayer insulating film 120 and the second interlayer insulating film 130 may include, but are not limited to, silicon nitride, silicon oxynitride or a low-k material having a low dielectric constant.

The mold structure MS may be cut by a word line cut region WLC. The word line cut region WLC may extend in a direction (e.g., the first direction X) that intersects the bit line 140. For example, the word line cut region WLC may extend in the first direction X to cut the mold structure MS.

Therefore, a plurality of gate electrodes (e.g., the ground selection line GSL, the plurality of word lines WL1 to WLn or the string selection line SSL) may be cut by the word line cut region WLC.

The word line cut region WLC may be formed over the cell array region CAR and the extension region ETR as shown in FIGS. 2 and 3. The width of the word line cut region WLC that cuts the mold structure MS may decrease toward the upper surface of the substrate 100. This may be attributed to the characteristics of the etching process for forming the word line cut region WLC.

A common source line CSL and/or a common source line spacer 150 may be formed in the word line cut region WLC.

The common source line spacer 150 may be made of silicon oxide, silicon nitride or oxynitride. The common source line CSL may be made of a conductive material. That is, the common source line CSL may be formed by the conductive pattern. For example, the common source line CSL may include a metal material such as tungsten (W), aluminum (Al) or copper (Cu).

As shown in FIG. 4, defects may not occur in the cell array region CAR of the nonvolatile memory device 2. However, defects may occur in the extension region ETR of the nonvolatile memory device 2. This will be explained through FIG. 5.

For reference, repeated contents of explanation of FIGS. 2 to 4 will be omitted in the following description, and differences will be mainly explained.

FIG. 5 is a cross-sectional view taken along a line B-B' of FIG. 3.

Referring to FIGS. 3 and 5, in the extension region ETR of the nonvolatile memory device 2, defects 308 and 310 may occur between the common source line CSL and at least some of a plurality of gate electrodes (e.g., the ground selection line GSL, the plurality of word lines WL1 to WLn or the string selection line SSL) or the mold structure MS.

For example, current or charge leakage may occur between the common source line CSL formed by the conductive pattern and the plurality of gate electrodes (e.g., the ground selection line GSL, the plurality of word lines WL1 to WLn or the string selection line SSL) of the extension region ETR.

For example, a defect 308 may occur due to the electric leakage between the word line cut region WLC, the second word line WL2 and the third word line WL3, in the extension region ETR. Alternatively, for example, a defect 310 may occur due to electrical leakage between the common source line CSL, the first word line WL1 and the second word line WL2, in the extension region ETR.

The common source line CSL in the extension region ETR is not formed by a conductive pattern, and the word line cut region WLC may be filled with an insulating material that does not conduct electricity and formed by an insulating pattern, thereby eliminating defects (e.g., 308 and 310) between the common source line CSL and at least some of the plurality of gate electrodes (e.g., the ground selection line GSL, the plurality of word lines WL1 to WLn or the string selection line SSL) in the extension region ETR.

The defects of FIGS. 2, 3 and 5 explained above are simply shown for convenience of showing, the shape of the defects is not limited thereto, and the number of defects and the occurrence position of the defects are, of course, not limited to those shown in FIGS. 2, 3, and 5 explained above.

Hereinafter, the nonvolatile memory device according to some embodiments for overcoming the above-explained defects and a method for fabricating the nonvolatile memory device according to some embodiments will be explained. Further, except for the explanation that overlaps the aforementioned description, the differences will be mainly explained.

Figure 6:
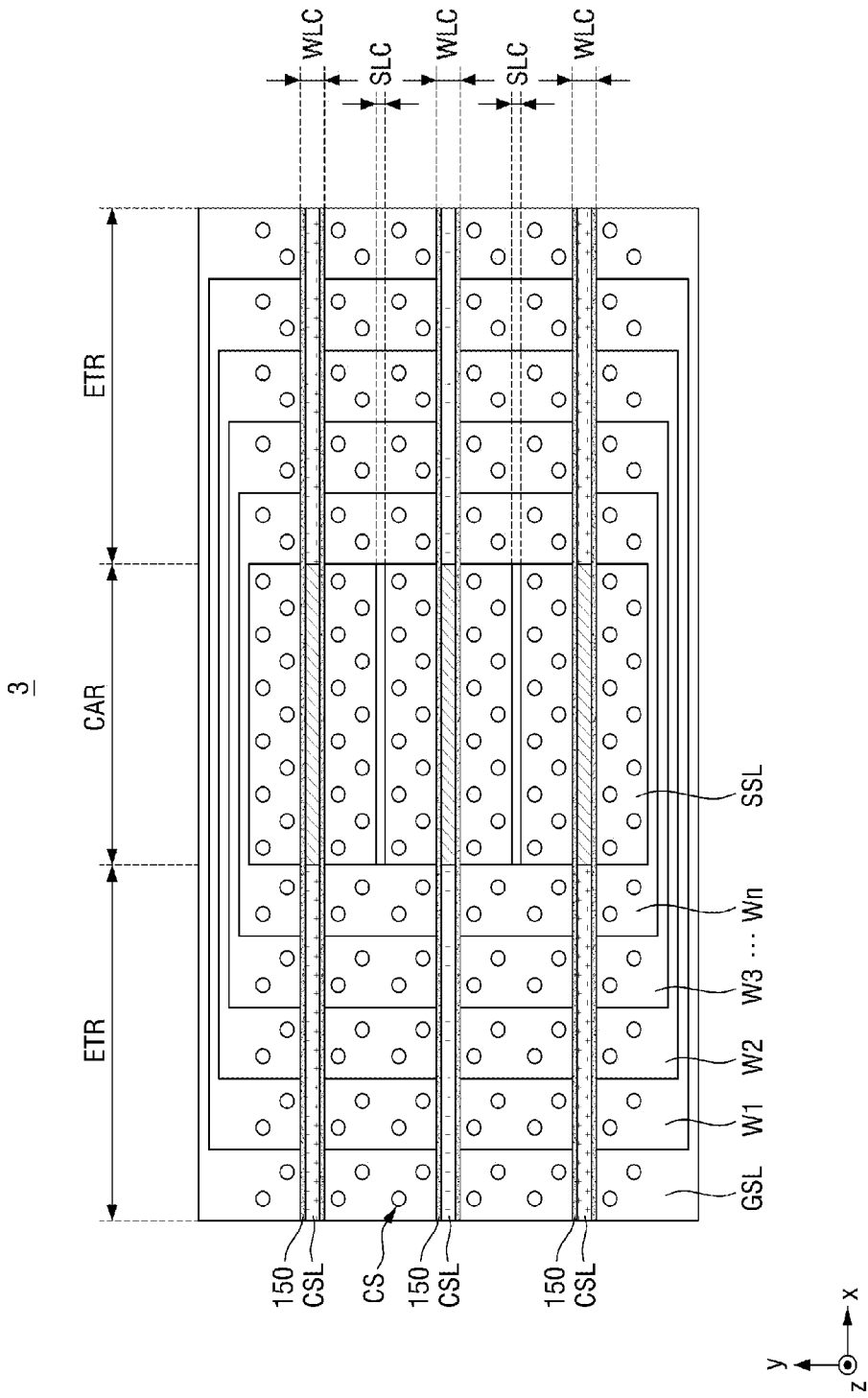
FIG. 6 is an example layout diagram for explaining the nonvolatile memory device according to some embodiments.

FIG. 6 is an example layout diagram for explaining the nonvolatile memory device according to some embodiments. For reference, the number of the plurality of gate electrodes (e.g., the ground selection line GSL, the plurality of word lines WL1 to WLn or the string selection line SSL) in the nonvolatile memory device according to some embodiments, the number of the plurality of channel structures CS, and the number and arrangement of the word line cut regions WLC are not limited to those of FIG. 6.

The nonvolatile memory device 3 according to some embodiments includes a common source line CSL in the word line cut region WLC. The word line cut region WLC according to some embodiments extends in the first direction X, and may cut the plurality of gate electrodes (e.g., the ground selection line GSL, the plurality of word lines WL1 to WLn or the string selection line SSL). In the common source line CSL according to some embodiments, the material formed in the cell array region CAR may be different from the material formed in the extension region ETR. That is, the common source line CSL of the memory cell array region CAR in which the memory operation is performed may be filled with the conductive material to form a conductive pattern. The common source line CSL of the memory cell array region CAR may include a conductive pattern extending in the first direction X. The conductive materials for forming the conductive patterns may include, but are not limited to, metals such as tungsten (W), cobalt (Co), and nickel (Ni) or semiconductor materials such as silicon.

The extension region ETR of the common source line CSL according to some embodiments may be filled with a material which does not conduct electricity to form an insulating pattern. The common source line CSL of the extension region ETR may include an insulating pattern extending in the first direction X. The insulating material for forming the insulating pattern may include, but is not limited to, a spin-on hard mask (SOH), an amorphous carbon layer (ACL), a silicon oxide and the like.

The common source line CSL in the word line cut region WLC formed in the extension region ETR of the nonvolatile memory device 3 according to some embodiments may be formed by the insulating pattern, thereby reducing an occurrence frequency of defects or eliminating the defects between the common source line CSL and the plurality of gate electrodes (e.g., the ground selection line GSL, the plurality of word lines WL1 to WLn or the string selection line SSL) in the extension region ETR. That is, when the common source line CSL of the extension region ETR is formed by the conductive pattern as in the nonvolatile memory devices 1 and 2 of FIGS. 2 and 3, the number of the defects occurring between the common source line CSL of the extension region ETR and the plurality of gate electrodes (e.g., the ground selection line GSL, the plurality of word lines WL1 to WLn or a string selection line SSL) may be reduced or all the defects may be eliminated in the nonvolatile memory device 3 according to some embodiments. Accordingly, defects formed in the nonvolatile memory device 3 according to some embodiments may be reduced or eliminated, and the reliability of the nonvolatile memory device 3 according to some embodiments and a semiconductor device or system including the nonvolatile memory device 3 according to the embodiment may be improved.

Figure 7:
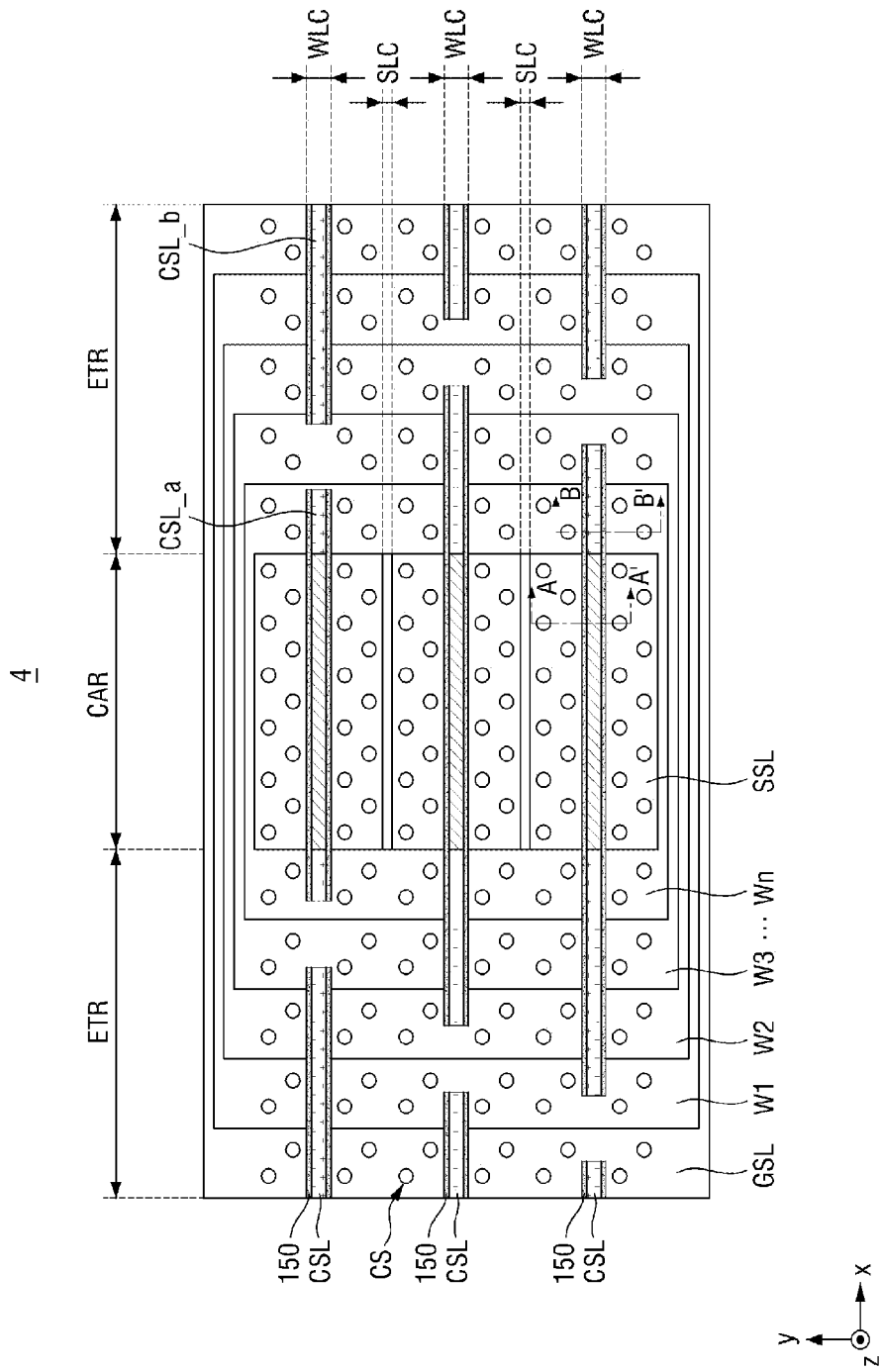
FIG. 7 is an example layout diagram for explaining the nonvolatile memory device according to some embodiments.

FIG. 7 is an example layout diagram for explaining the nonvolatile memory device according to some embodiments. For reference, the number of the plurality of gate electrodes (e.g., the ground selection line GSL, the plurality of word lines WL1 to WLn or the string selection line SSL) in the nonvolatile memory device according to some embodiments, the number of the plurality of channel structures CS, and the number and arrangement of the word line cut regions WLC are not limited to those shown in FIG. 7.

Referring to FIG. 7, a nonvolatile memory device 4 according to some embodiments may have a shape in which some of the common source lines CSL of the extension region ETR are disconnected, unlike the nonvolatile memory device 3 according to some embodiments of FIG. 6.

That is, referring to FIG. 7, unlike FIG. 6, the nonvolatile memory device 4 may have an H-CUT shape in which disconnected regions of the common source line CSL are formed in the extension region ETR of the nonvolatile memory device 4. For example, some of the common source line CSL are disconnected, and a first sub-common source line CSL and a second sub-common source line CSL may be formed. That is, the first sub-common source line CSL and the second sub-common source line CSL may be placed apart from each other in the first direction X. Therefore, some of the plurality of gate electrodes (e.g., the ground selection line GSL, the plurality of word lines WL1 to WLn or the string selection line SSL) around the first sub-common source line CSL and the second sub-common source line CSL may have an H shape. Some of the plurality of gate electrodes (e.g., the ground selection line GSL, the plurality of word lines WL1 to WLn or the string selection line SSL) may be electrically connected to each other through a spaced region between the first sub-common source line CSL and the second sub-common source line CSL.

For reference, the common source line CSL disconnected in the extension region ETR includes an insulating pattern. Therefore, the first sub-common source line CSL and the second sub-common source line CSL may become a first sub-insulating pattern CSL_a and a second sub-insulating pattern CSL_b, respectively. The common source line CSL in the word line cut region WLC formed in the extension region ETR of the nonvolatile memory device 4 according to some embodiments may formed by an insulating pattern, thereby reducing the occurrence frequency of defects or eliminating the defects, between the common source line CSL and the plurality of gate electrodes (e.g., the ground selection line GSL, the plurality of word lines WL1 to WLn or the string selection line SSL) in the extension region ETR. That is, when the common source line CSL of the extension region ETR is formed by the conductive pattern as in the nonvolatile memory devices 1 and 2 of FIGS. 2 and 3, the number of defects that occur between the common source line CSL and the plurality of gate electrodes (e.g., the ground selection line GSL, the plurality of word lines WL1 to WLn or the string selection line SSL) of the extension region ETR may be reduced or all the defects may be eliminated in the nonvolatile memory device 4 according to some embodiments. Accordingly, defects formed in the nonvolatile memory device 4 according to some embodiments may be reduced or eliminated, and the reliability of the nonvolatile memory device 4 according to some embodiments and a semiconductor device or system including the nonvolatile memory device 4 according to some embodiments may be improved.

The number and the stacked form of the plurality of gate electrodes (e.g., the ground selection line GSL, the plurality of word lines WL1 to WLn or the string selection line SSL) shown in the semiconductor devices 3 and 4 according to some embodiments are not limited to those shown in FIGS. 6 and 7. Further, the arrangement of the channel structures CS of the semiconductor devices 3 and 4 according to some embodiments is not also limited to those shown in FIGS. 6 and 7.

FIGS. 8 to 12 are example cross-sectional views of the nonvolatile memory device of FIG. 7 according to some embodiments taken along a line B-B'. FIG. 13 is another example cross-sectional view of the nonvolatile memory device of FIG. 7 according to some embodiments taken along the line B-B'. For reference, the explanation of the line B-B' explained in FIGS. 8 to 13 may, of course, be applied to the cross-section at the same position in FIG. 6.

Figure 8:
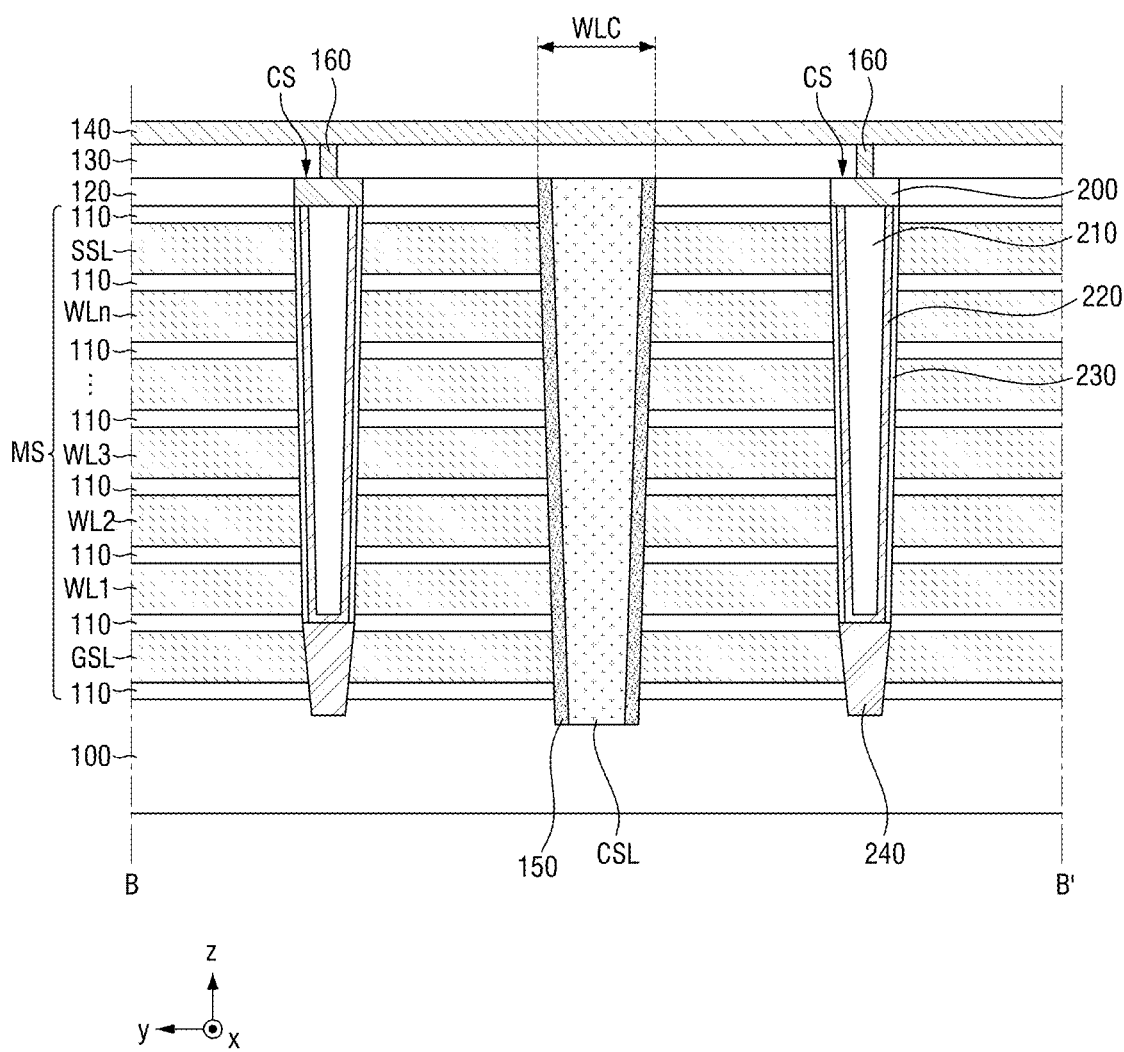
FIGS. 8 to 12 are example cross-sectional views of the nonvolatile memory device of FIG. 7 according to some embodiments taken along a line B-B'.

FIGS. 7 and 8 are cross-sectional views taken along the line B-B' of the nonvolatile memory device 4 including an insulating pattern forming a common source line CSL of the extension region ETR of FIG. 7. In the explanation of this cross section, repeated parts of explanation of FIG. 5 will be omitted, and differences will be mainly explained.

The common source line CSL of the extension region ETR of the nonvolatile memory device 4 according to some embodiments may be filled with an insulating material to form an insulating pattern extending in the first direction X. At this time, unlike FIG. 5, since the extension region ETR of the common source line CSL according to some embodiments is filled with the insulating material, there is no electrical leakage between the common source line CSL and a plurality of gate electrodes (e.g., the ground selection line GSL, the plurality of word lines WL1 to WLn or the string selection line SSL). That is, there is no defect between the common source line CSL and the plurality of gate electrodes (e.g., the ground selection line GSL, the plurality of word lines WL1 to WLn or the string selection line SSL) or the occurrence frequency of defects may be reduced.

Figure 9:
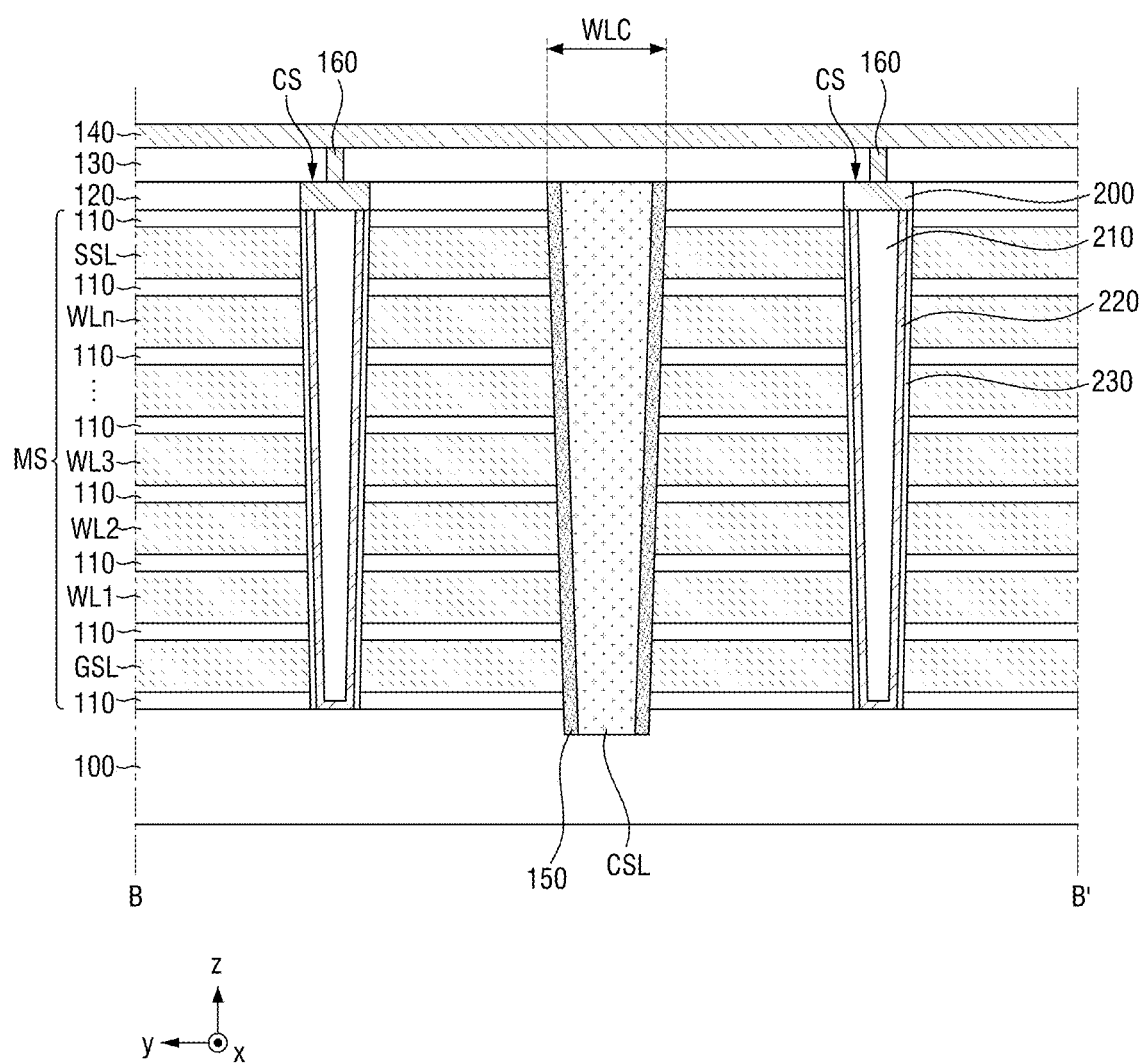

Referring to FIGS. 8 and 9, the nonvolatile memory device of FIG. 9 according to some embodiments differs from the nonvolatile memory device of FIG. 8 according to some embodiments in that a second semiconductor pattern 240 may not be formed between the lowermost stage of the channel structure CS in the third direction z and the substrate 100. Since the explanation of nonvolatile memory device of FIG. 9 according to some embodiments is the same as that of FIG. 8 except for the presence or absence of the second semiconductor pattern 240, repeated explanation of contents of FIG. 8 will not be provided.

Figure 10:
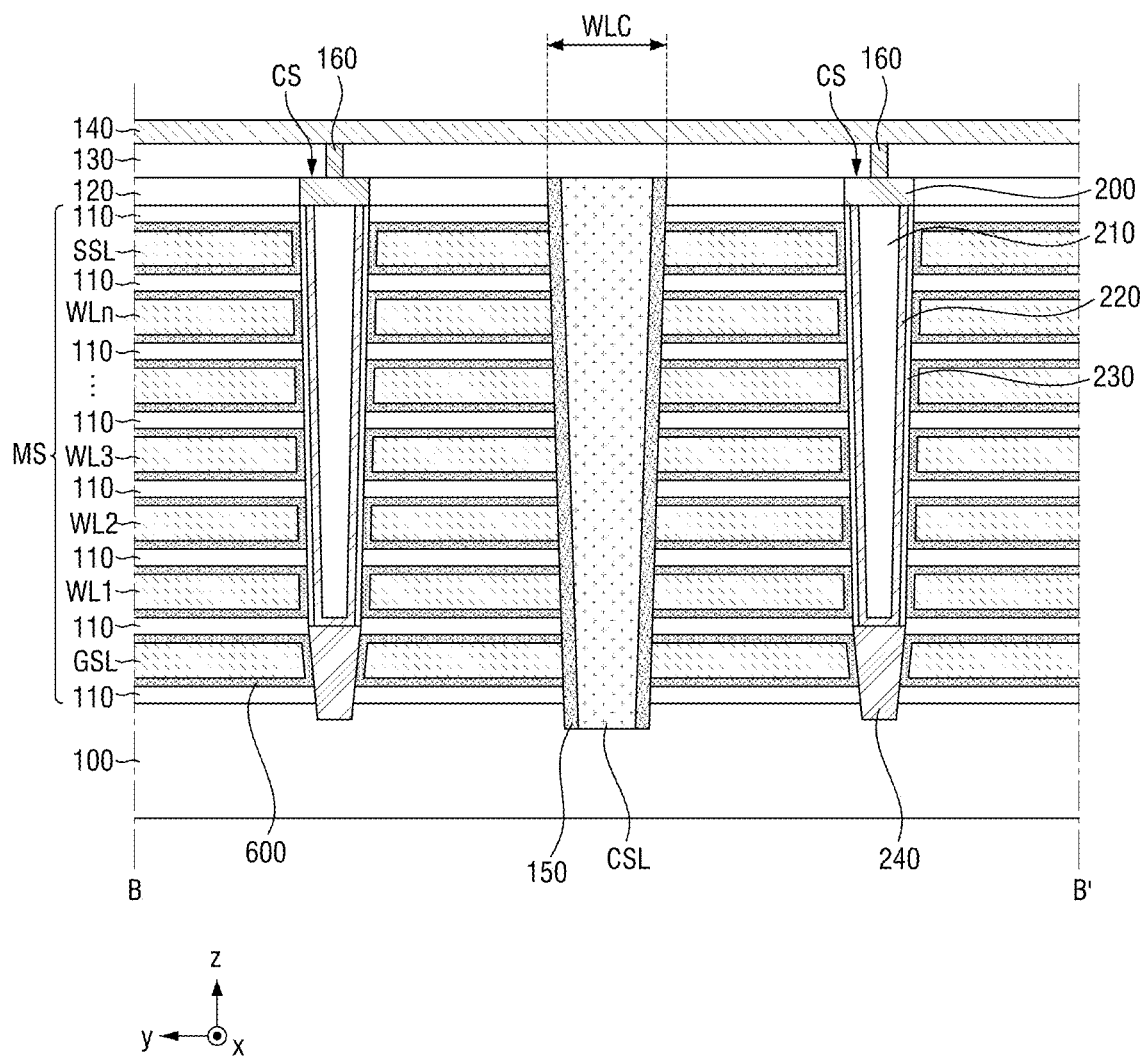

Referring to FIGS. 8 and 10, the nonvolatile memory device of FIG. 10 according to some embodiments differs from the nonvolatile memory device of FIG. 8 according to some embodiments in that some of the upper surface, the lower surface, and the sidewalls of the plurality of gate electrodes (e.g., the ground selection line GSL, the plurality of word lines WL1 to WLn or the string selection line SSL) may be surrounded by a blocking insulating film 600.

The blocking insulating film 600 may conformally cover the upper surface, the lower surface, and the sidewalls of the plurality of gate electrodes (e.g., the ground selection line GSL, the plurality of word lines WL1 to WLn or the string selection line SSL).

The blocking insulating film 600 may reduce or prevent charges trapped in the information storage film 230 from being released to a plurality of gate electrodes (e.g., the plurality of word lines WL1 to WLn), and may reduce or prevent charges of the plurality of gate electrodes (e.g., the plurality of word lines WL1 to WLn) from being captured by the information storage film 230.

The blocking insulating film 600 may be formed by silicon oxide ($SiO_2$), silicon nitride ($Si_3N_4$), silicon oxynitride (SiON), a high-k material or a composite layer stacked by combination thereof. The high-k material may include, but is not limited to, at least one of aluminum oxide ($Al_2O_3$), yttrium oxide ($Y_2O_3$), and zirconium oxide ($ZrO_2$).

Since the explanation of the nonvolatile memory device of FIG. 10 according to some embodiments is the same as that of FIG. 8 except for the presence or absence of the blocking insulating film 600, repeated explanation of contents of FIG. 8 will not be provided.

Figure 11:
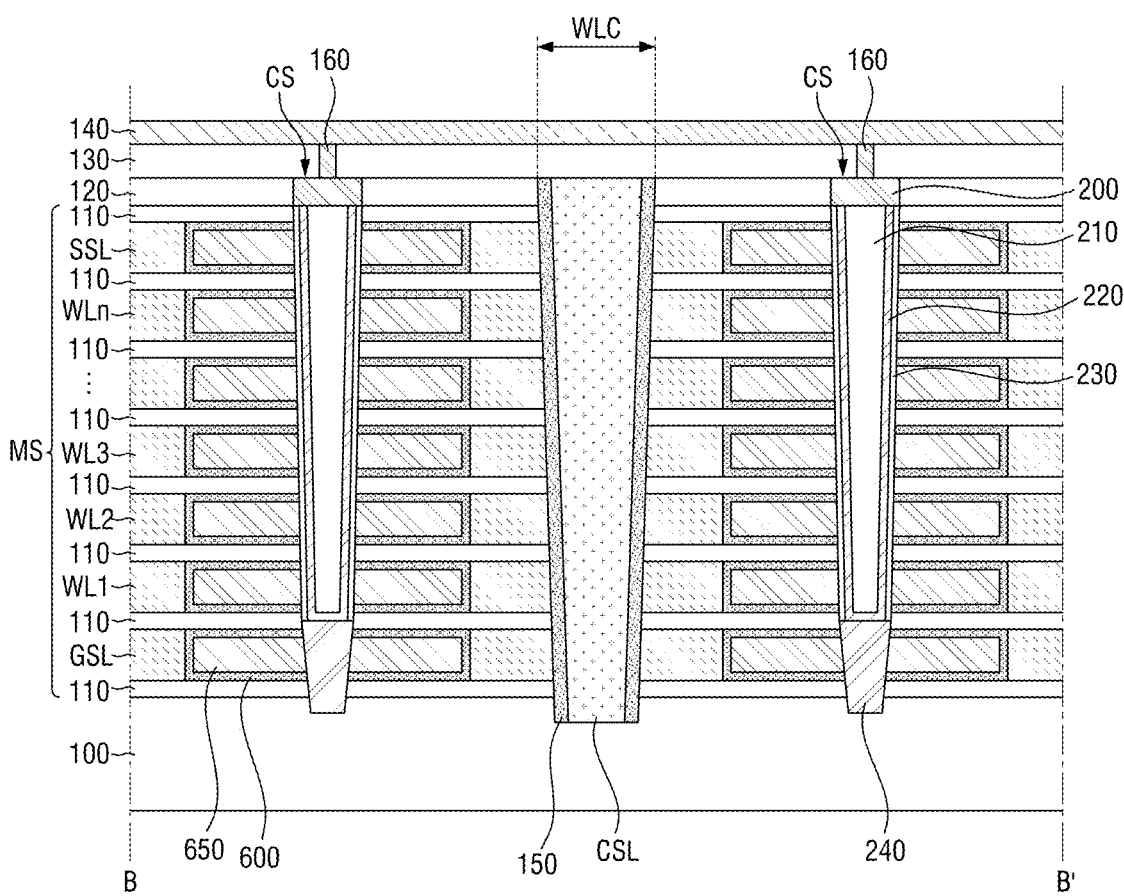

Referring to FIGS. 8 and 11, the nonvolatile memory device of FIG. 11 according to some embodiments differs from the nonvolatile memory device of FIG. 8 according to some embodiments in that a floating gate 650 surrounded by the blocking insulating film 600 may be further included between the plurality of gate electrodes (e.g., the ground selection line GSL, the plurality of word lines WL1 to WLn or the string selection line SSL) and the channel structure CS. The blocking insulating film 600 may conformally cover some of the upper surface, the lower surface, and the sidewalls of the floating gate 650.

The blocking insulating film 600 may reduce or prevent charges trapped in the floating gate 650 from being released to a plurality of gate electrodes (e.g., the plurality of word lines WL1 to WLn), and may reduce or prevent charges of the plurality of gate electrodes (e.g., the plurality of word lines WL1 to WLn) from being captured by the floating gate 650. The floating gate 650 according to some embodiments may be, but is not limited to, polysilicon. Further, in the nonvolatile memory device including the floating gate 650 of FIG. 11 according to some embodiments, the information storage film 230 may be a silicon oxide layer.

Since the explanation of the nonvolatile memory device of FIG. 11 according to some embodiments is the same as that of FIG. 8 except for the presence or absence of the floating gate 650 surrounded by the blocking insulating film 600, the repeated explanation of contents of FIG. 8 will not be provided.

Figure 12:
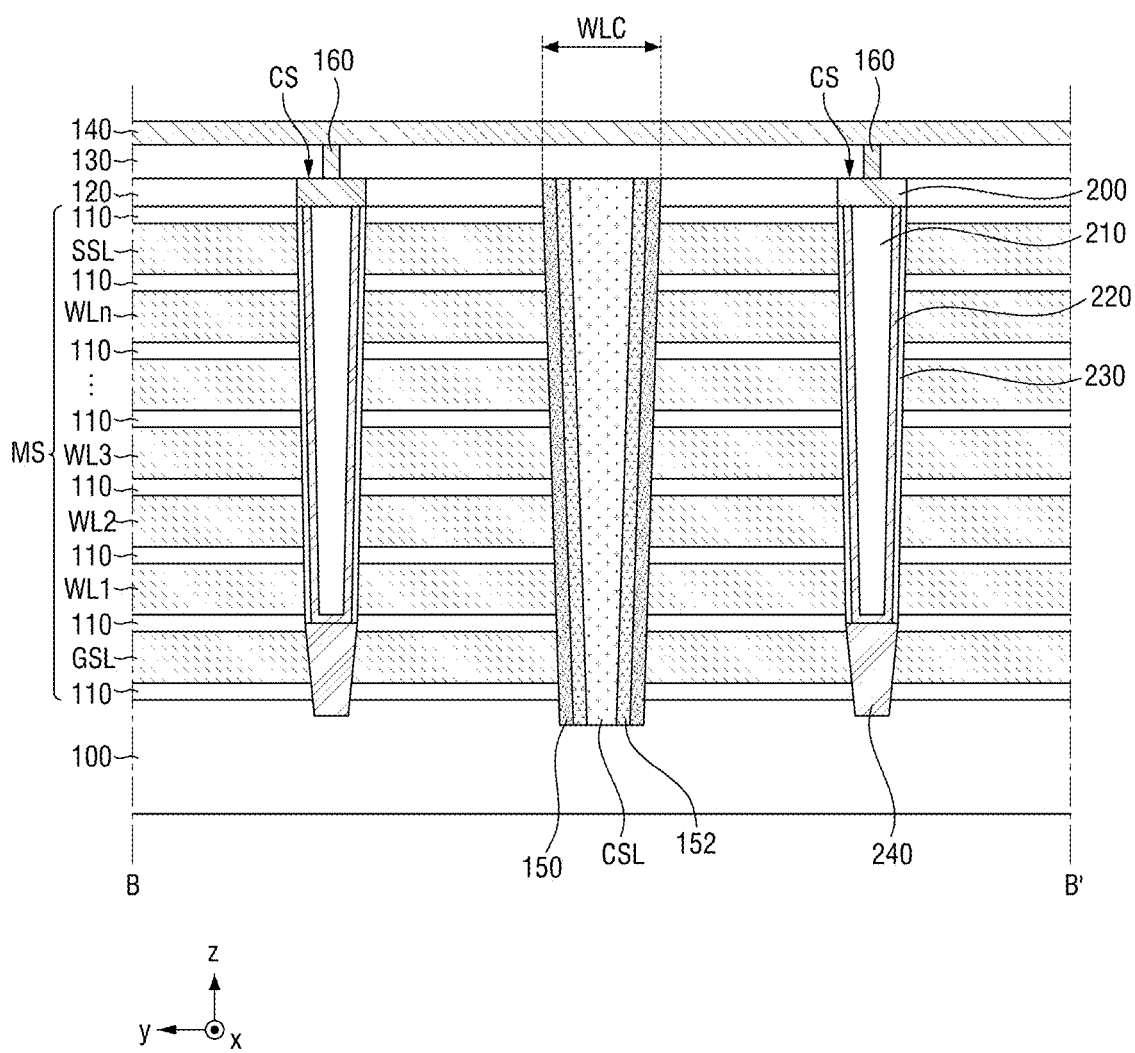
Figure 13:
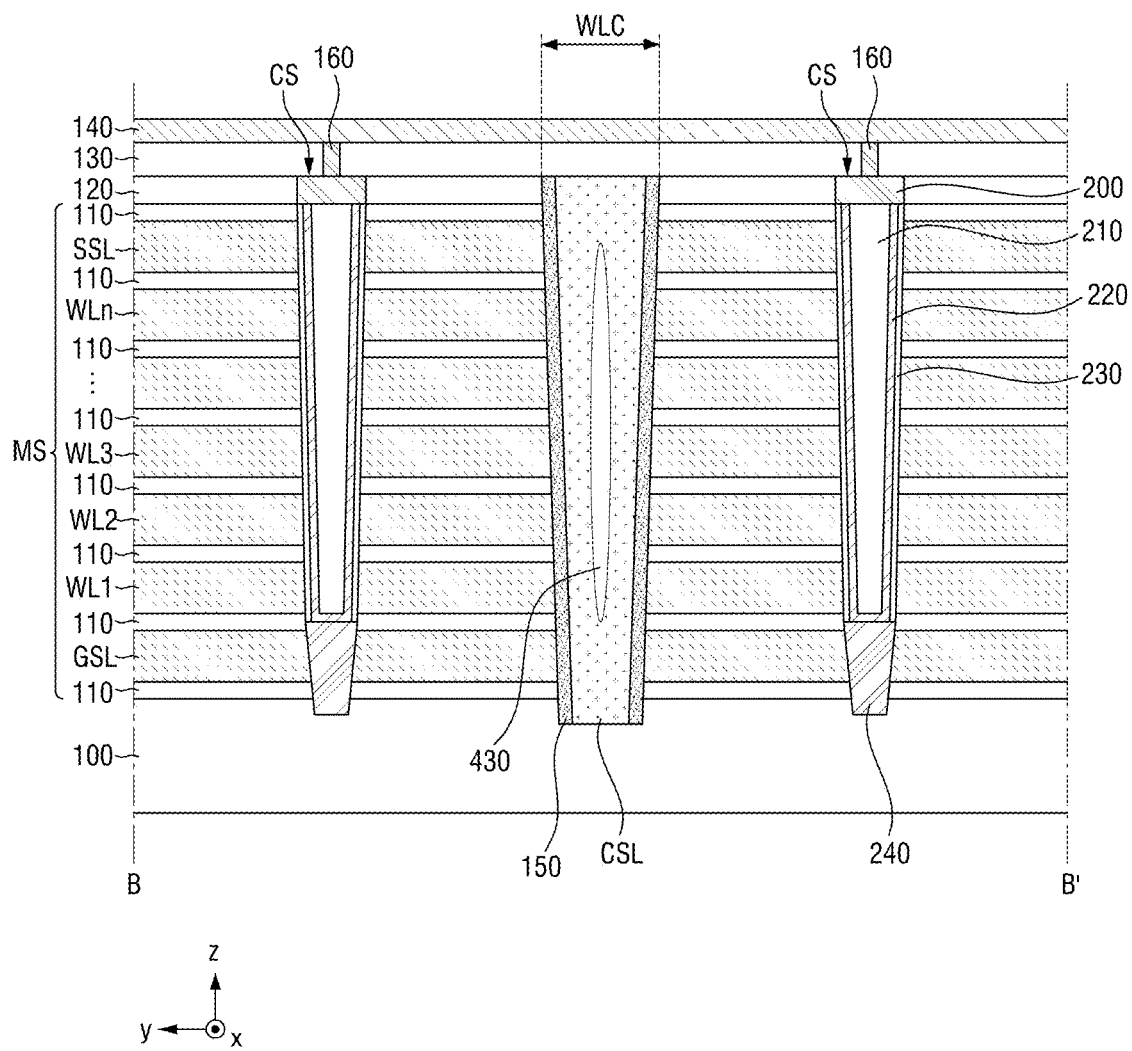
FIG. 13 is another example cross-sectional view of the nonvolatile memory device of FIG. 7 according to some embodiments taken along the line B-B'.

Referring to FIGS. 8 and 12, the nonvolatile memory device of FIG. 12 according to some embodiments differs from the nonvolatile memory device of FIG. 8 according to some embodiments in that an additional common source line spacer 152 is further included between the common source line spacer 150 and the common source line CSL including an insulating material. The additional common source line spacer 152 may be made of silicon oxide, silicon nitride or silicon oxynitride.

Since the explanation of the nonvolatile memory device of FIG. 12 according to some embodiments is the same as that of FIG. 8 except for the presence or absence of the additional common source line spacer 152, the repeated explanation of contents of FIG. 8 will not be provided.

Referring to FIGS. 7 and 13, the common source line CSL of the extension region ETR according to some embodiments may include an air gap 430 in the insulating pattern.

The air gap 430 is a void defined surrounded by the peripheral insulating pattern, and may have a dielectric constant lower than that of silicon oxide. This makes it possible to more efficiently reduce or prevent an electric leakage which may occur between the common source line CSL and the plurality of gate electrodes (e.g., the ground selection line GSL, the plurality of word lines WL1 to WLn or the string selection line SSL).

FIGS. 14 to 22 are example cross-sectional views for explaining the intermediate steps of a method for fabricating a nonvolatile memory device according to some embodiments. For reference, FIGS. 14 to 22 explain the cross-section A-A' and the cross-section B-B' of FIG. 7 together. The explanation of FIGS. 14 to 22 may, of course, be applied as the explanation of FIG. 6. Further, FIGS. 14 to 22 also explain intermediate steps of the method for fabricating the nonvolatile memory device of FIG. 8 according to some embodiments. The intermediate steps of the method for fabricating the nonvolatile memory device according to FIGS. 14 to 22 according to some embodiments may, of course, be applied to the method for fabricating the nonvolatile memory device of FIGS. 9 to 13 according to some embodiments.

Hereinafter, in some embodiments where the processes of the cross-section A-A' and the cross-section B-B' are repeated, the process of the cross-section A-A' will be mainly explained. At this time, it is a matter of course that the process of cross-section A-A' is also, applied to B-B'.

Figure 14:
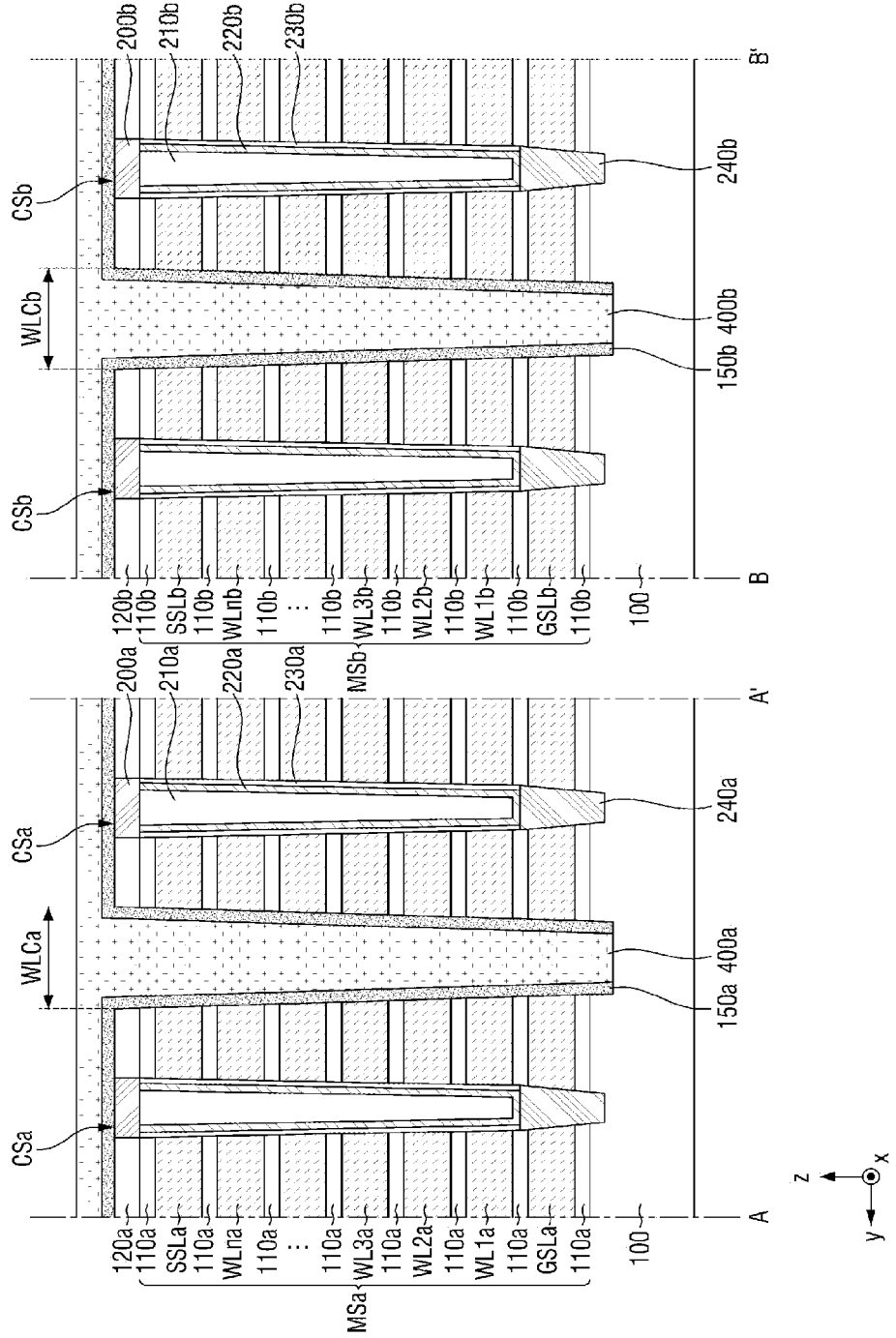
FIGS. 14 to 22 are example cross-sectional views for explaining the intermediate steps of a method for fabricating a nonvolatile memory device according to some embodiments.

Referring to FIG. 14, first insulating patterns 110a and a plurality of gate electrodes (e.g., ground selection lines GSLa and GSLb, a plurality of word lines WL1a to WLna and WL1b to WLnb or string selection lines SSLa and SSLb) alternately stacked on the substrate 100 in the third direction Z may be formed. For example, the substrate 100, the first insulating patterns 110a and 110b, the ground selection lines GSLa and GSLb, the first insulating patterns 110a and 110b, the first word lines WL1a and WL1b, and the first insulating patterns 110a and 110b may be sequentially stacked. The first insulating patterns 110a and 110b and the plurality of gate electrodes (e.g., the ground selection lines GSLa and GSLb, the plurality of word lines WL1a to WLna and WL1b to WLnb or the string selection lines SSLa and SSLb) may form mold structures MSa and MSb. Second insulating patterns 120a and 120b may be formed on the mold structures MSa and MSb. Thereafter, a plurality of channel structures CSa and CSb penetrating the mold structures MSa and MSb and the second insulating patterns 120a and 120b may be formed. Since the explanation of the plurality of channel structures CSa and CSb is the same as the explanation of the plurality of channel structures CS explained in FIG. 4, the explanation will not be provided. Thereafter, the mold structures MSa and MSb may be cut to form word line cut regions WLCa and WLCb extending in the first direction X. The word line cut regions WLCa and WLCb may expose the substrate 100 and separate each of the plurality of channel structures CSa and CSb in the second direction Y.

Common source line spacers 150a and 150b and insulating patterns 400a and 400b may be formed in the word line cut regions WLCa and WLCb according to some embodiments. For example, the common source line spacers 150a and 150b may be conformally formed on the sidewalls of the word line cut regions WLCa and WLCb, the uppermost parts of each of the plurality of channel structures CSa and CSb in the third direction Z, and the second insulating patterns 120a and 120b. The insulating patterns 400a and 400b are formed along the common source line spacers 150a and 150b, and may be formed by filling the inside of the word line cut regions WLCa and WLCb with an insulating material.

Figure 15:
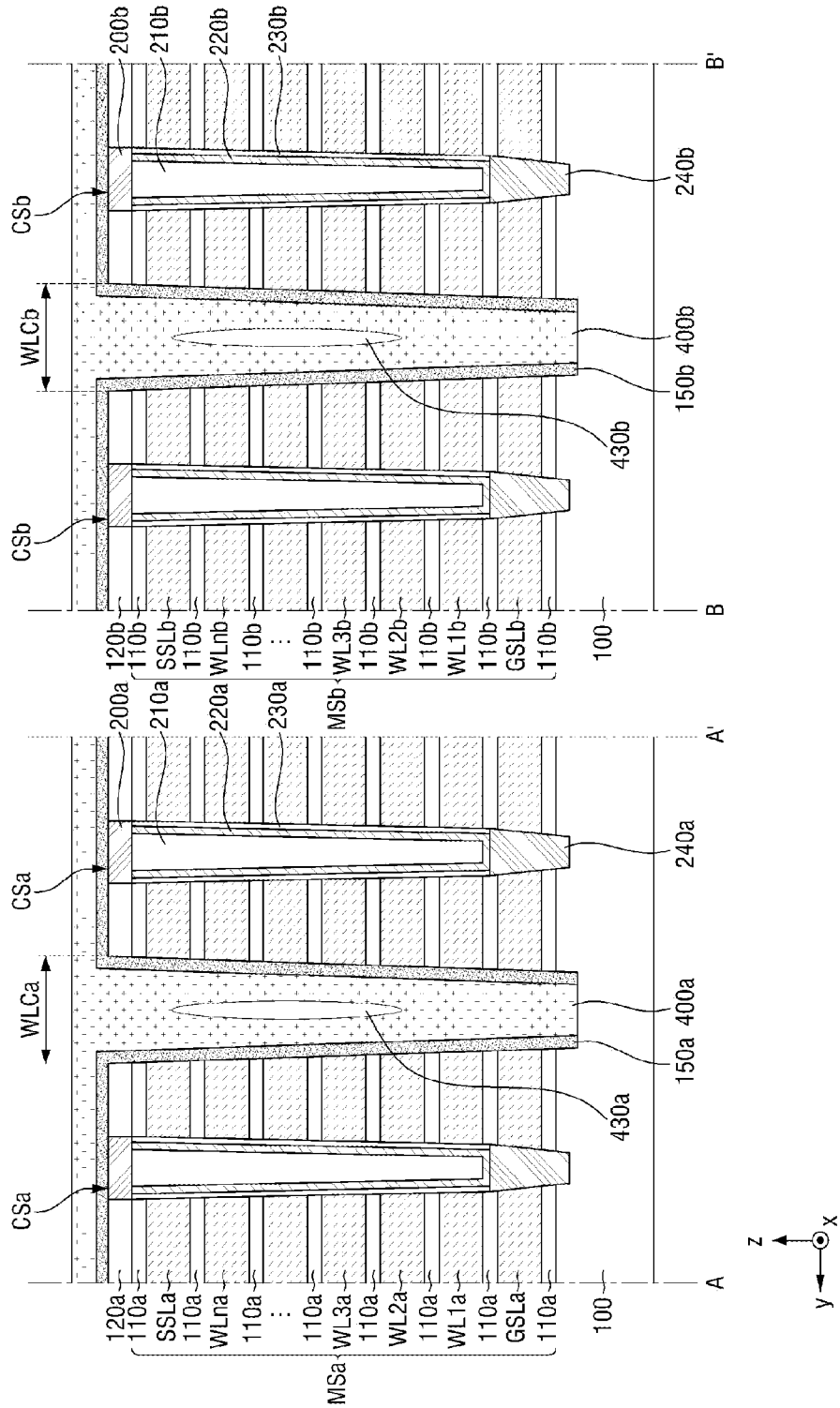

Referring to FIG. 15, air gaps 430a and 430b may be formed inside the insulating patterns 400a and 400b. The air gap 430b may be an air gap 430 formed in FIG. 13.

Figure 16:
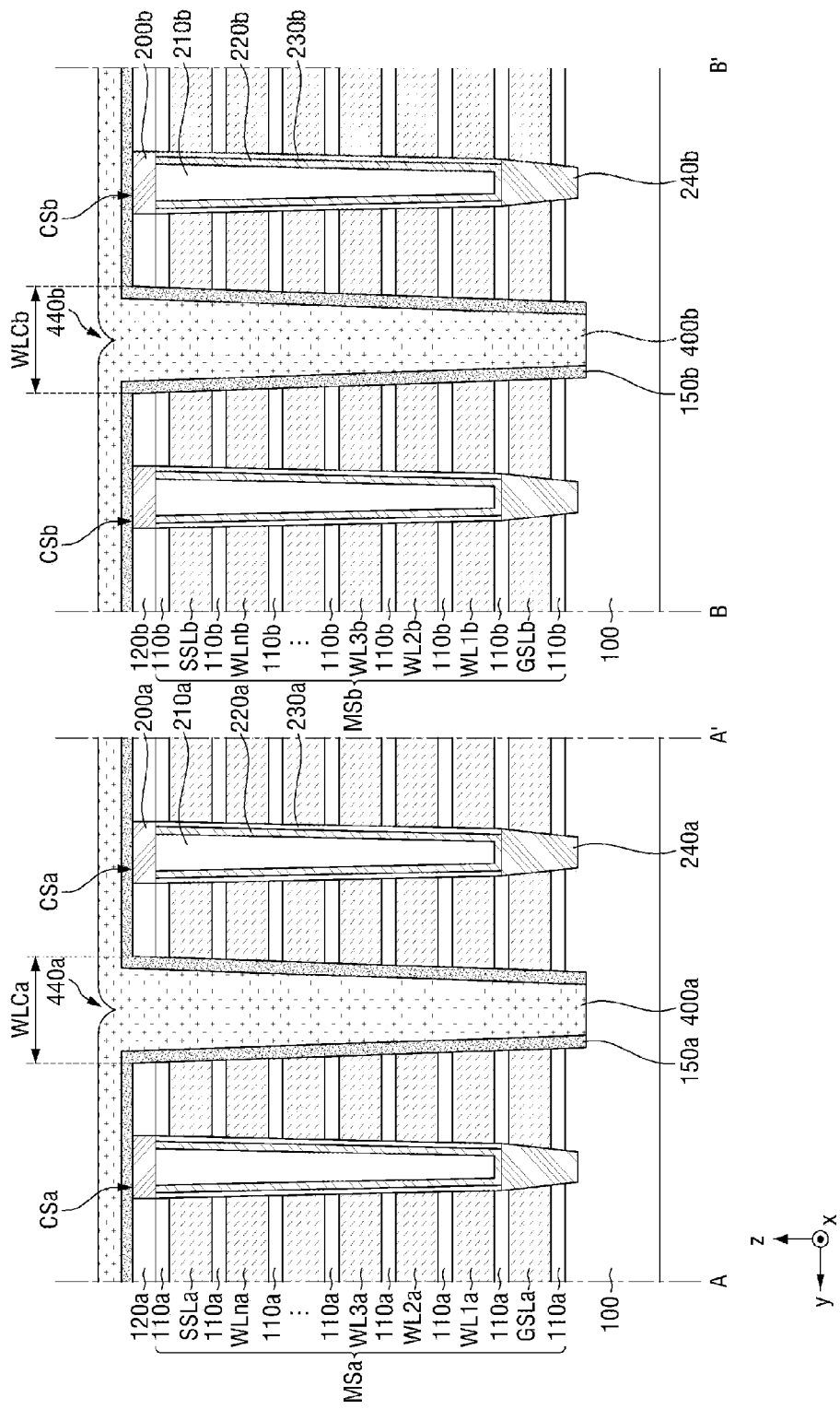

Alternatively, referring to FIG. 16, in the process of forming the insulating patterns 400a and 400b by filling the inside of the word line cut regions WLCa and WLCb with the insulating material, depressions 440a and 440b in which the insulating material is depressed into the word line cut regions WLCa and WLCb may be included. This may be naturally formed in the process of filling the inside of the word line cut regions WLCa and WLCb with the insulating material.

Figure 17:
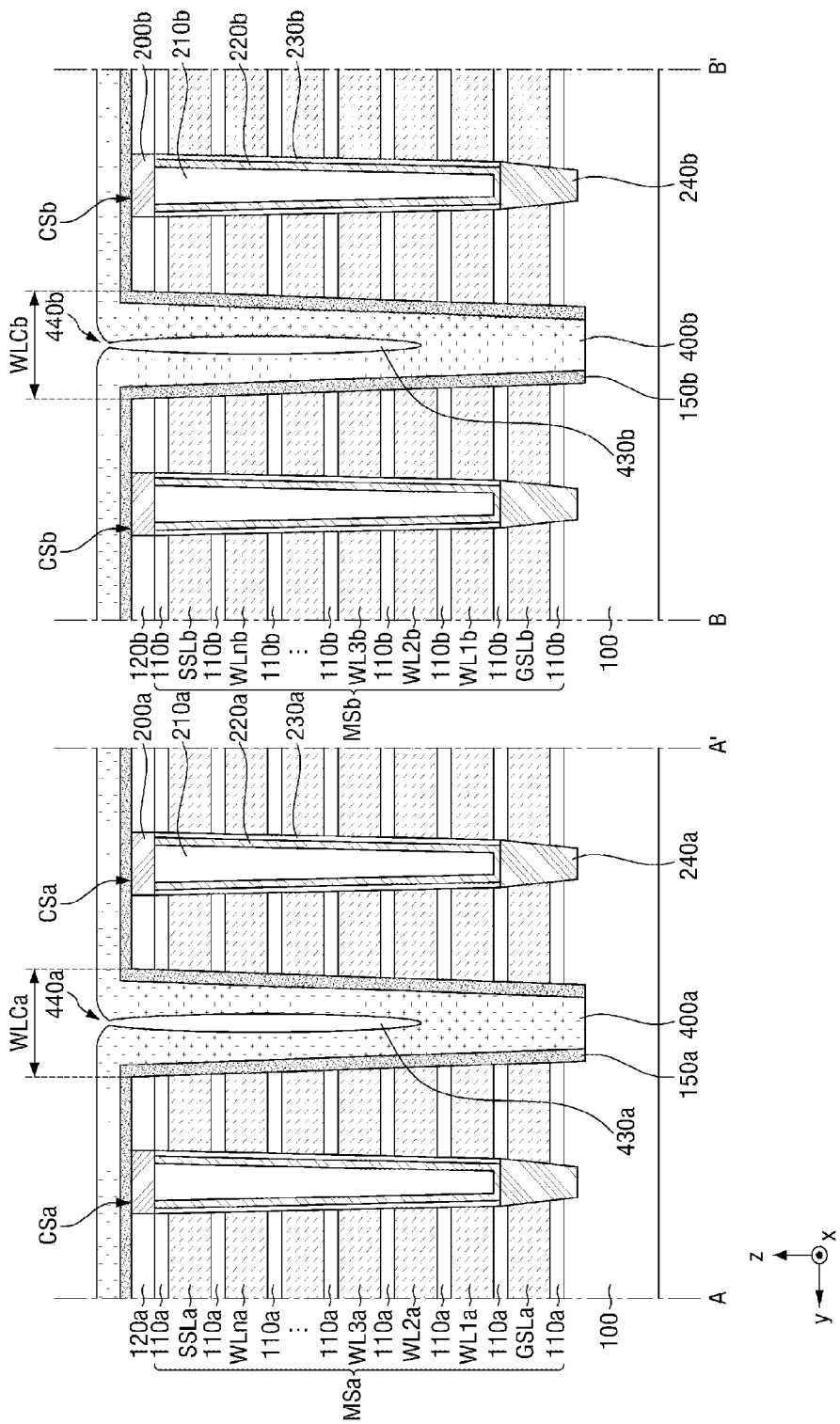

Referring to a method for fabricating a nonvolatile memory device according to some embodiments of FIG. 17, air gaps 430a and 430b and depressions 440a and 440b may be formed inside the insulating patterns 400a and 400b.

Widths of the word line cut regions WLCa and WLCb may be relatively wider than widths of the plurality of channel structures CSa and CSb in the second direction Y. Therefore, in the process of filling the inside of the word line cut regions WLCa and WLCb with the insulating material, the lowermost parts of the word line cut regions WLCa and WLCb in the third direction Z may be fully filled with the insulating material, but the upper parts of the word line cut regions WLCa and WLCb may not be fully filled with the insulating material. That is, as shown in FIG. 17, since the insulating material is formed along the upper sidewalls in the word line cut regions WLCa and WLCb, the air gaps 430a and 430b are formed in the word line cut regions WLCa and WLCb, and the depressions 440a and 440b may also be formed at the uppermost parts of the word line cut regions WLCa and WLCb.

In the following drawings, for convenience of explanation, a method for fabricating a nonvolatile memory device according to some embodiments, in which the air gaps 430a and 430b and the depressions 440a and 440b are not formed, will be explained. Accordingly, the explanation in the following drawings may, of course, be provided as a method for fabricating a nonvolatile memory device according to some embodiments in which air gaps 430a, 430b and depressions 440a and 440b are formed.

Figure 18:
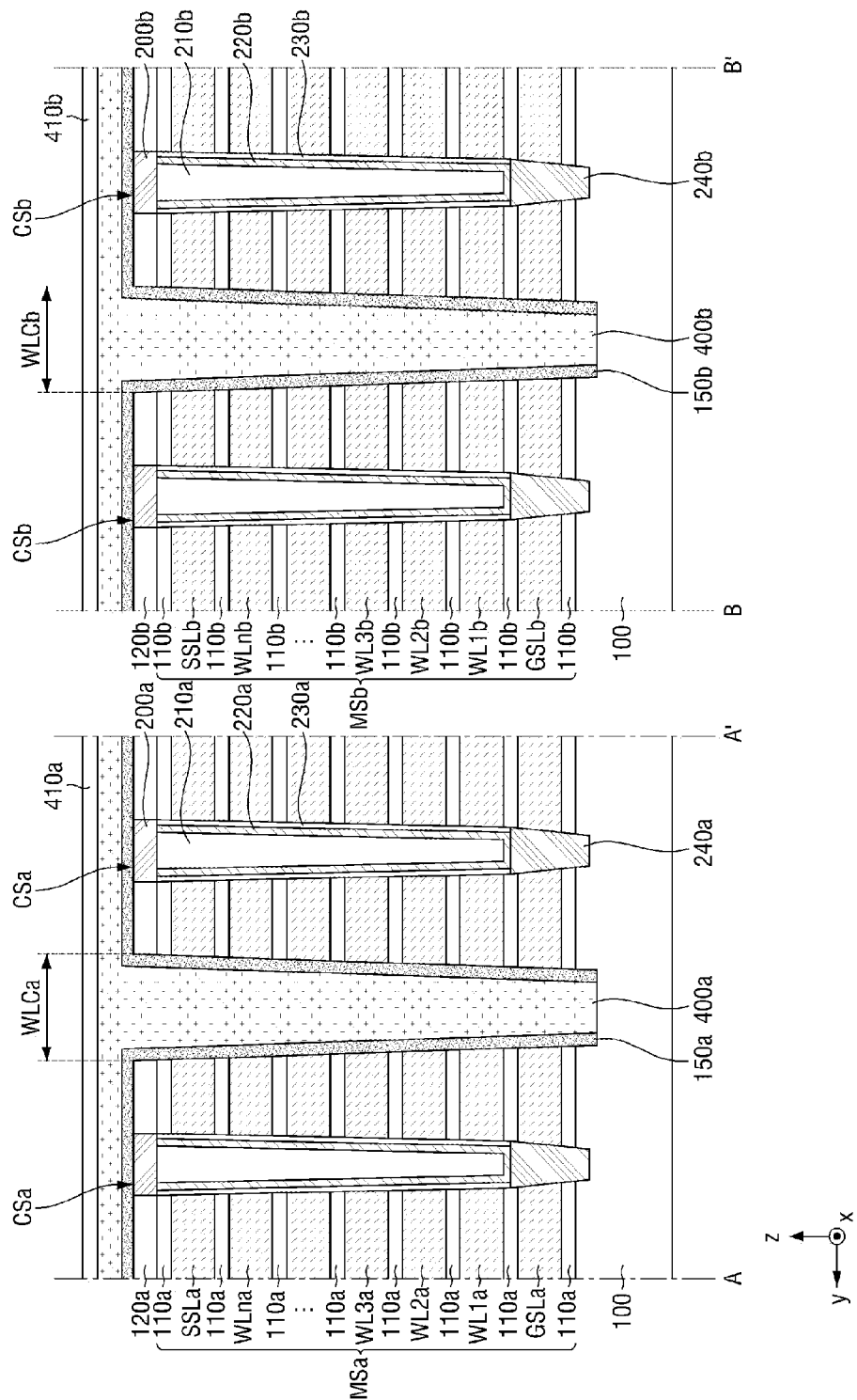

Referring to FIG. 18, passivation layers 410a, 410b may be formed on the insulating patterns 400a and 400b. The passivation layers 410a and 410b may protect the insulating pattern 400b when forming a conductive material later. The passivation layers 410a and 410b may be formed of, but is not limited to, for example, PE-TEOS (Plasma Enhanced Tetra Ethyle Ortho Silicate).

Figure 19:
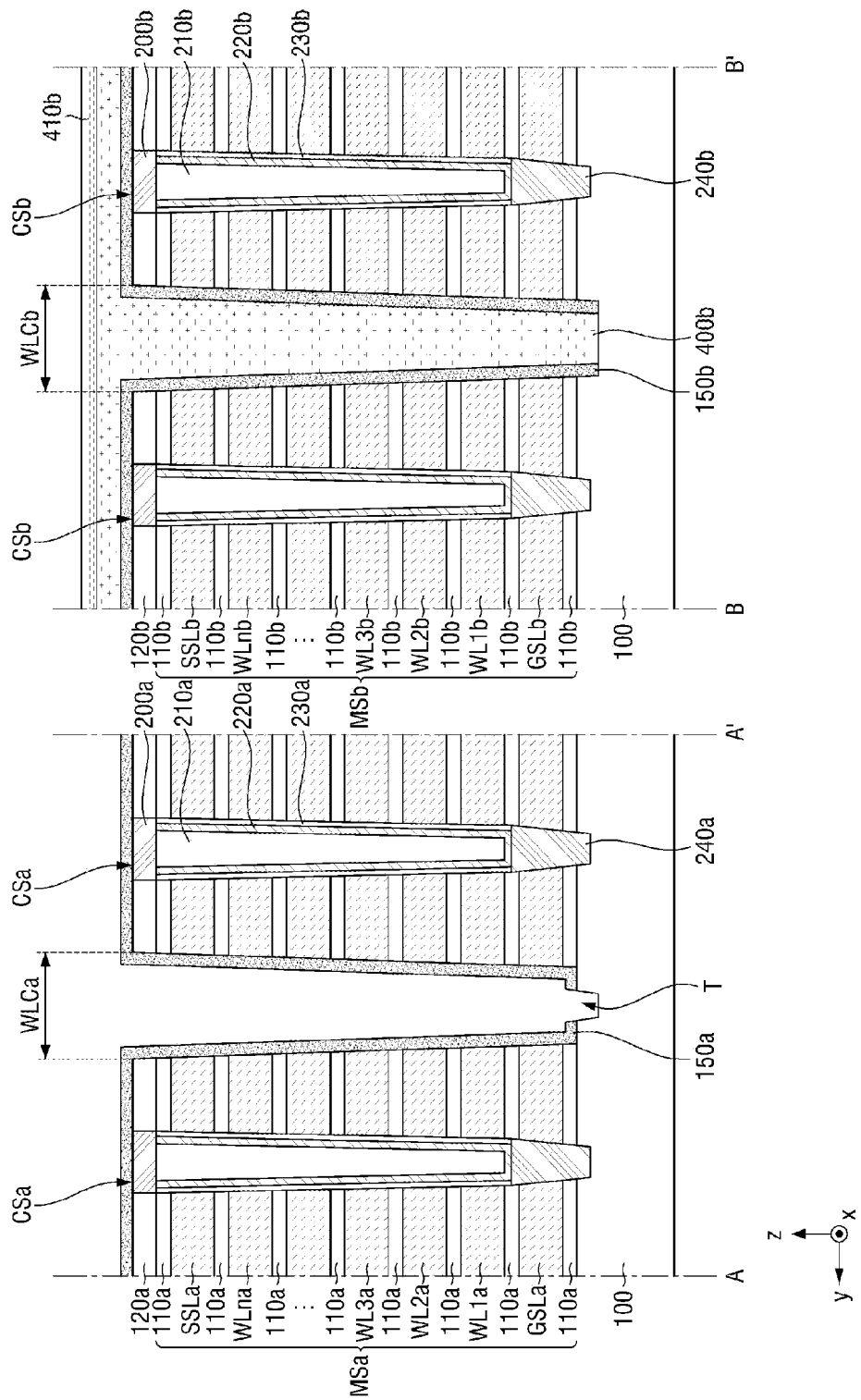

Referring to FIGS. 7 and 19, the insulating pattern 400a and the passivation layer 410a may be removed through a lithography process and an etching process using a mask, in order to fill a conductive material only in the word line cut region WLCa of the cell array region CAR of the nonvolatile memory device according to some embodiments. At this time, a trench T may be formed by performing another etching so that the word line cut region WLCa in the cell array region CAR is further formed inside the substrate 100.

Figure 20:
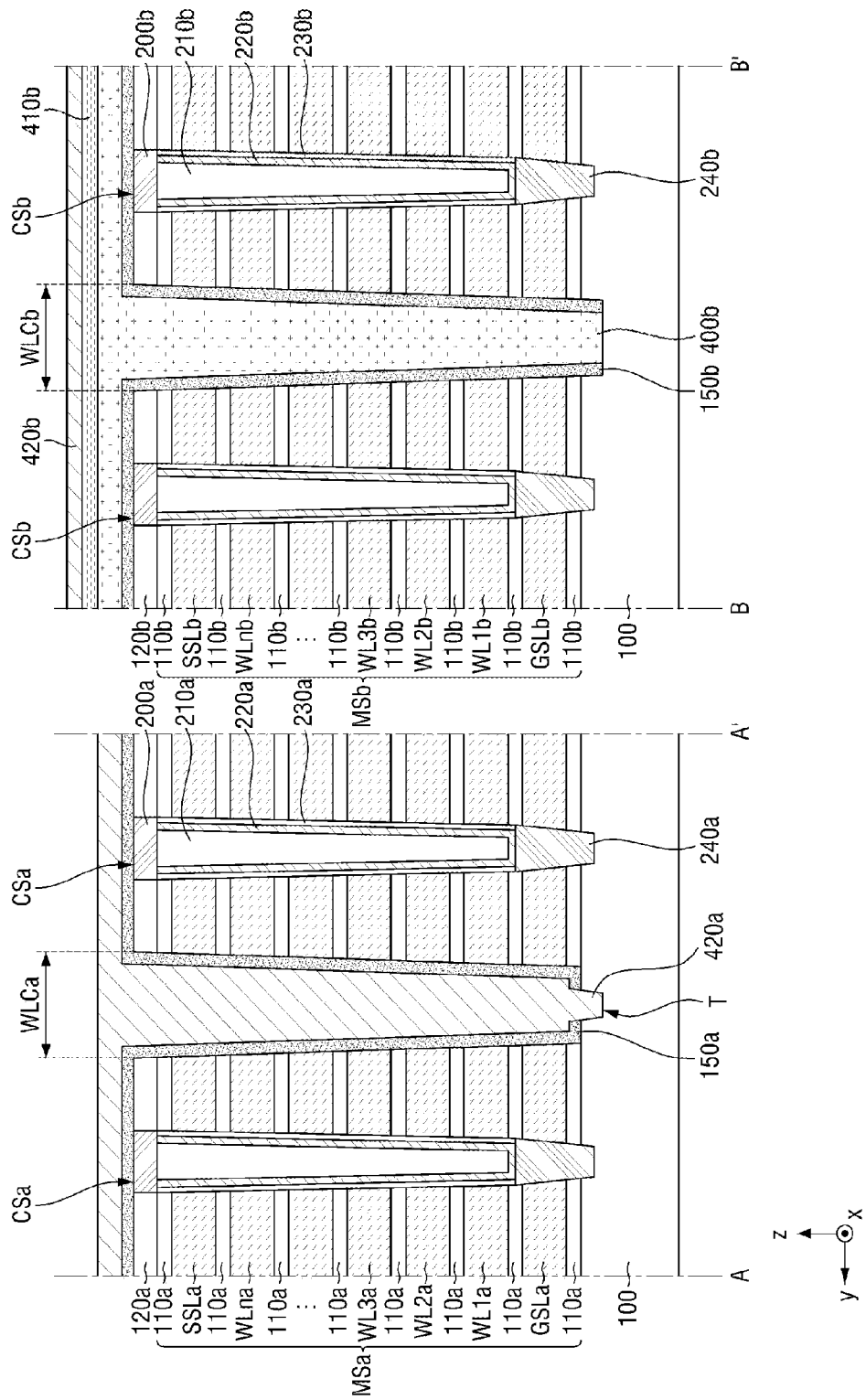

Referring to FIG. 20, a conductive material may be filled inside the word line cut region WLCa on the first interlayer insulating film 120a, the channel structure CSa and the passivation layer 410b. The conductive material may also fill the inside of the trench T. The above-mentioned conductive material may form a conductive pattern in the word line cut region WLCa.

Figure 21:
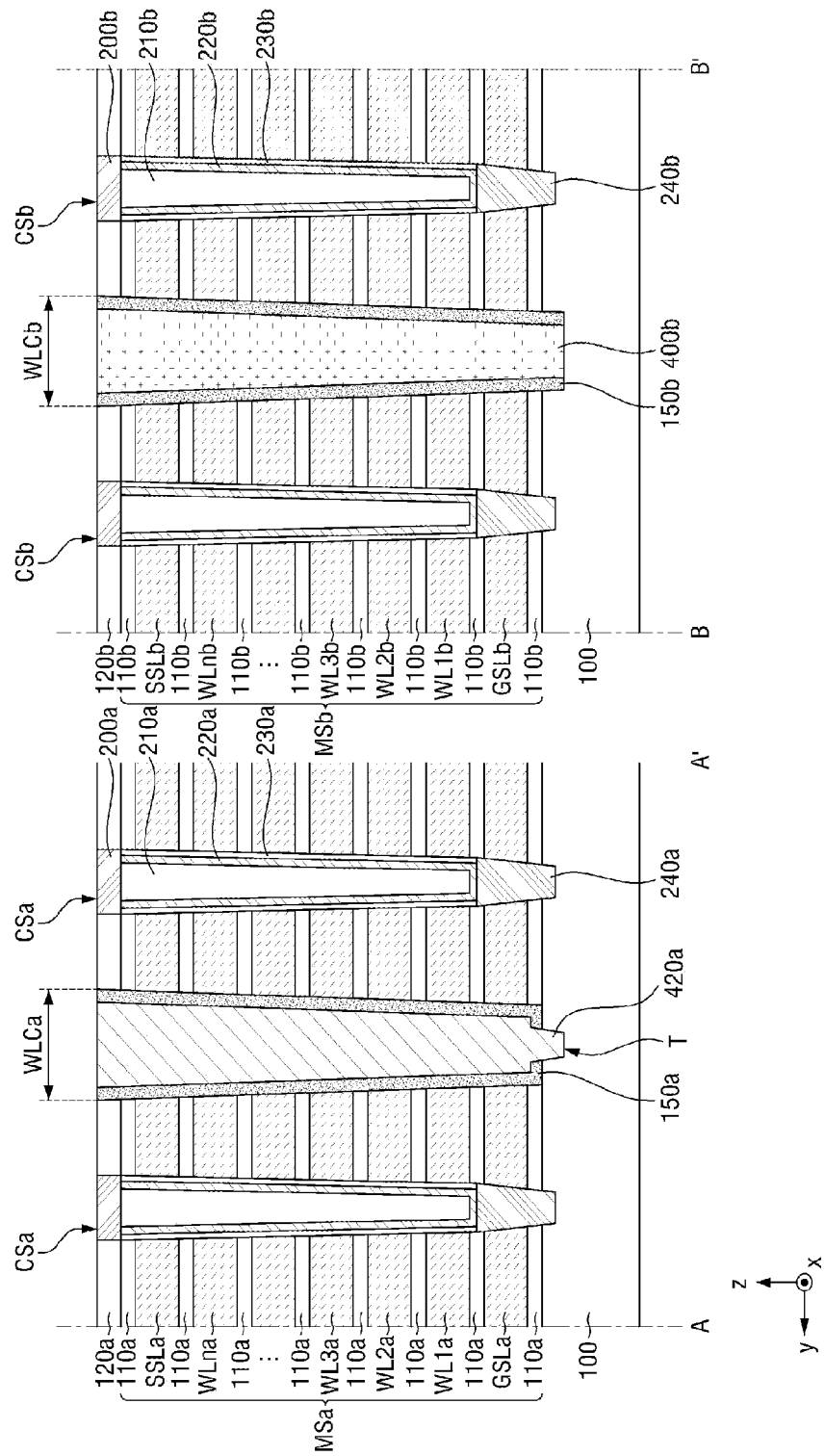

Referring to FIG. 21, the remaining conductive materials except for the common source line spacer 150a in the word line cut region WLCa and the conductive pattern 420a in the word line cut region WLCa are removed. That is, the conductive patterns 420a and 420b on the plurality of channel structures CSa and CSb, the first interlayer insulating film 120a, the uppermost part of the word line cut region WLCa, and the passivation layer 410b may be removed. Also, the passivation layer 410b may also be removed.

Thereafter, all the remaining insulating materials except for the common source line spacer 150b in the word line cut region WLCb and the insulating pattern 400b in the word line cut region WLCb are removed. That is, the insulating pattern 400b on the plurality of channel structures CSb, the first interlayer insulating film 120b, and the uppermost part of the word line cut region WLCb may be removed.

Figure 22:
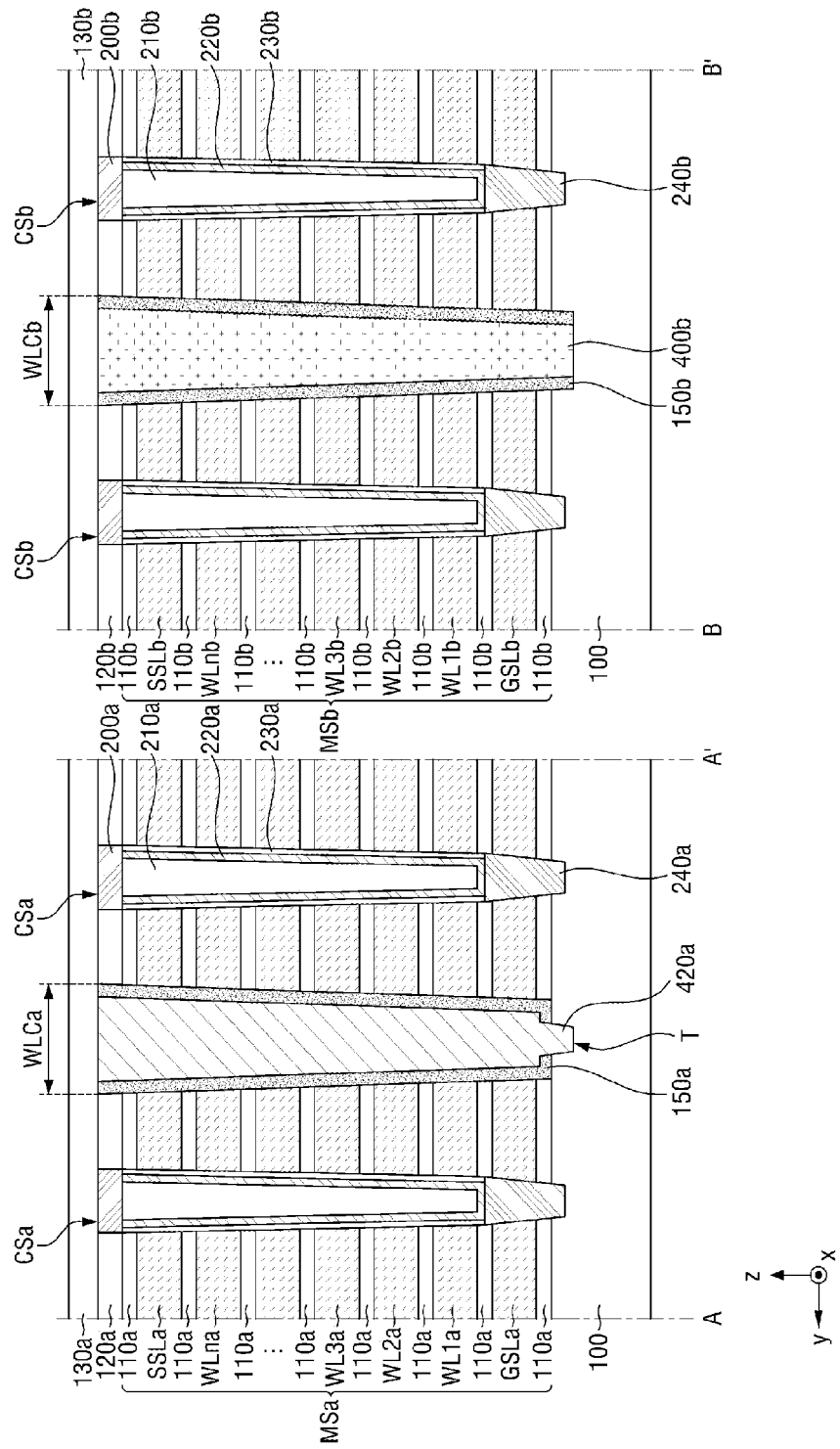

Referring to FIG. 22, the second interlayer insulating films 130a and 130b may be formed on the first interlayer insulating films 120a and 120b, the plurality of channel structures CSa and CSb, and the uppermost parts of the word line cut regions WLCa and WLCb.

Thereafter, a bit line contact penetrating the second interlayer insulating films 130a and 130b may be formed like the bit line contact 160 of FIG. 8. The bit line contact 160 may be connected to a plurality of channel structures CSa and CSb. Thereafter, as shown in FIG. 8, the bit line 140 may be formed on the second interlayer insulating films 130a and 130b and the bit line contact 160. That is, as shown in FIG. 8, the bit line 140 may be electrically connected to the plurality of channel structures CS through the bit line contact 160.

Figure 23:
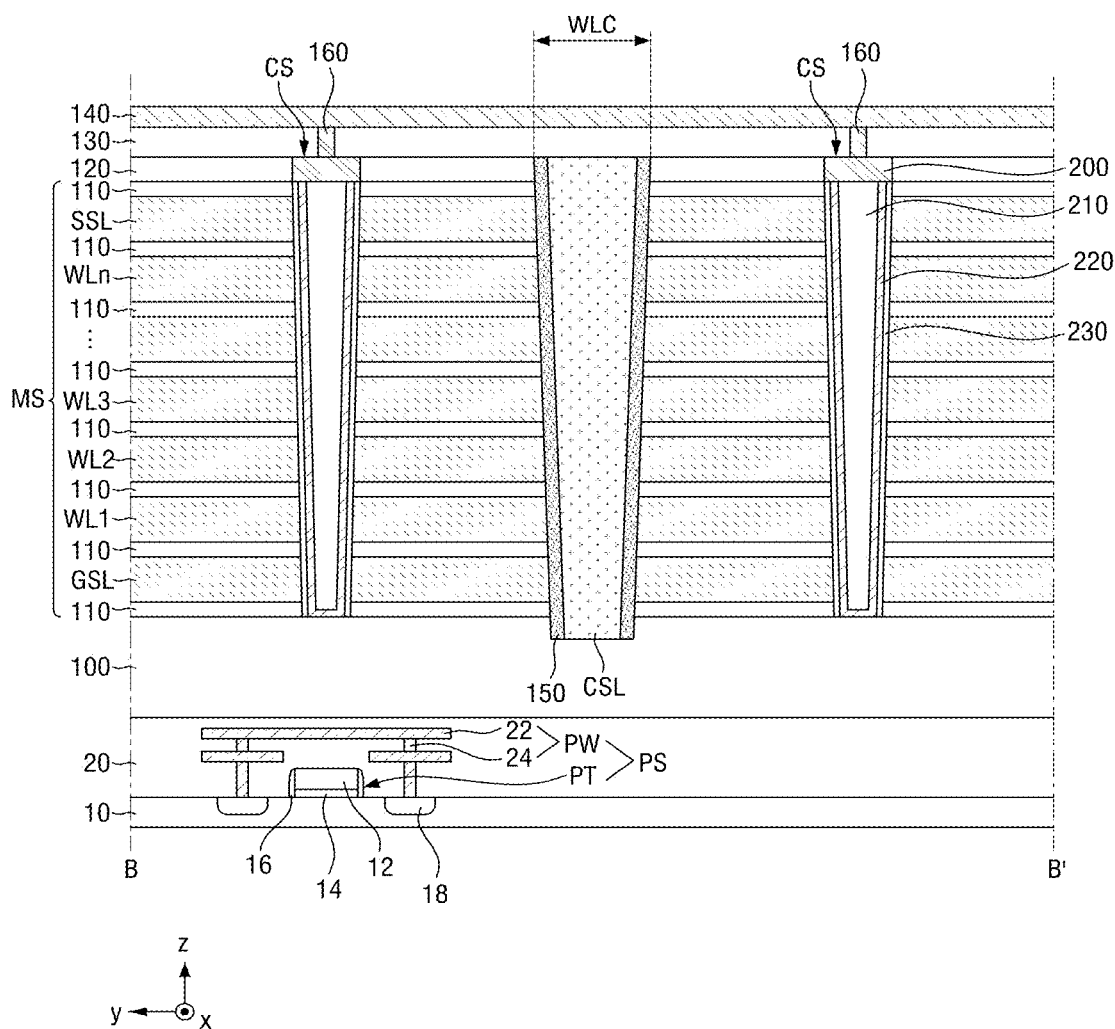
FIGS. 23 and 24 are example cross-sectional views of the nonvolatile memory device of FIG. 7 taken along a line B-B' according to some embodiments.
Figure 24:
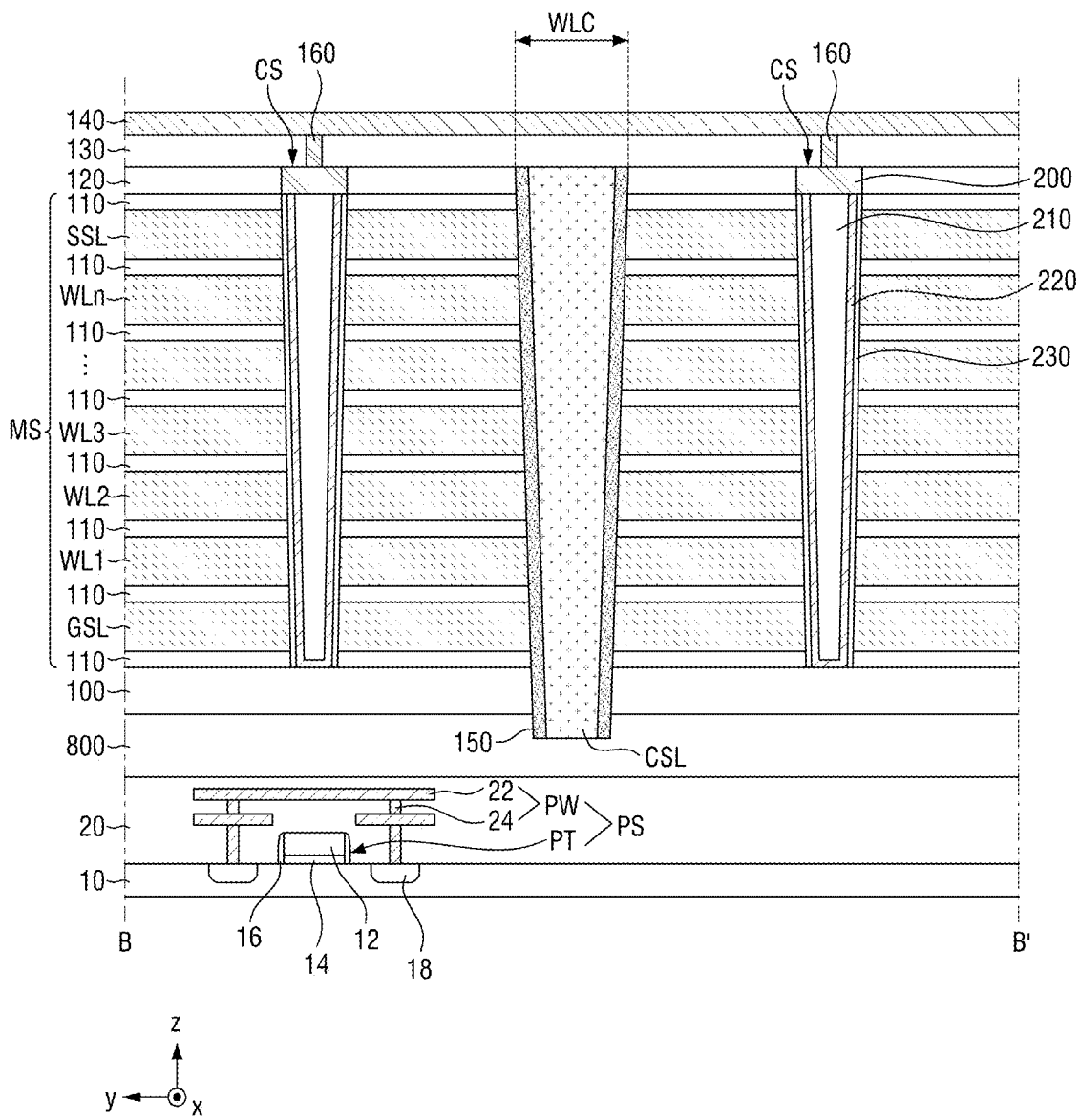

FIGS. 23 and 24 are example cross-sectional views of the nonvolatile memory device of FIG. 7 taken along a line B-B' according to some embodiments.

Referring to FIG. 23, unlike FIG. 8, the nonvolatile memory device according to some embodiments may further include a base substrate 10 and a peripheral circuit structure PS below the substrate 100. This may be called a COP (Cell On Peripheral) structure.

The base substrate 10 may include, for example, a semiconductor substrate such as a silicon substrate, a germanium substrate or a silicon-germanium substrate. Alternatively, the base substrate 10 may include a silicon-on-insulator (SOI) substrate or a germanium-on-insulator (GOI) substrate.

The peripheral circuit structure PS may be formed on the base substrate 10. The peripheral circuit structure PS may constitute a peripheral circuit that controls the operation of each memory cell. For example, the peripheral circuit structure PS may include a row decoder 520, a page buffer 530, a control logic 550, and the like, which will be explained later in FIG. 27. For example, as explained in FIG. 23, the peripheral circuit structure PS may include a peripheral circuit element PT and a wiring structure PW.

In some embodiments, the peripheral circuit device PT may include a transistor. For example, the peripheral circuit element PT may include a peripheral circuit gate electrode 12, a peripheral circuit gate insulating film 14, a gate spacer 16, and a source/drain region 18.

In some embodiments, the peripheral circuit device PT may be a high-voltage transistor. Although some embodiments in which the peripheral circuit element PT is a transistor has been explained, this is merely an example, and the technical idea of the present inventive concepts is not limited thereto. For example, the peripheral circuit element PT may include not only various active elements such as a transistor, but also various passive elements such as a capacitor, a resistor, and an inductor.

In some embodiments, the third interlayer insulating film 20 may be formed on the base substrate 10. The third interlayer insulating film 20 may be formed to cover the peripheral circuit element PT on the base substrate 10. Although the third interlayer insulating film 20 is shown as a single film, this is only for convenience of explanation, and the third interlayer insulating film 20 may, of course, be a multi-film formed by stacking a plurality of insulating films. The third interlayer insulating film 20 may include, but is not limited to, for example, silicon oxide.

The wiring structure PW may include peripheral circuit wirings 22 and the peripheral circuit contacts 24. The peripheral circuit wirings 22 and the peripheral circuit contacts 24 may be formed, for example, in the third interlayer insulating film 20. The peripheral circuit wirings 22 may be connected to the peripheral circuit element PT through the peripheral circuit contacts 24. The peripheral circuit wirings 22 may include, but are not limited to, for example, a metal (e.g., copper (Cu) or aluminum (Al)). The peripheral circuit contacts 24 may include, for example, but are not limited to, silicon (e.g., polysilicon) or metal (e.g., tungsten (W) or copper (Cu)).

The explanation of the COP structure of FIG. 23 will not be provided in order to avoid repeated explanation in FIGS. 24 and 28 later.

Referring to FIG. 24, unlike the nonvolatile memory device of FIG. 23 according to some embodiments, a common source line plate 800 may be further provided between the third interlayer insulating film 20 and the substrate 100.

The common source line plate 800 may include tungsten silicide (WSi). At this time, since the materials forming the common source line plate 800 and the substrate 100 are different from each other, etching rates of etching the respective common source line plates 800 and the substrate 100 are different from each other in a fabricating process such as etching. Thus, a step may be formed at a point on which the common source line plate 800 and the substrate 100 meet the word line cut region WLC.

Figure 25:
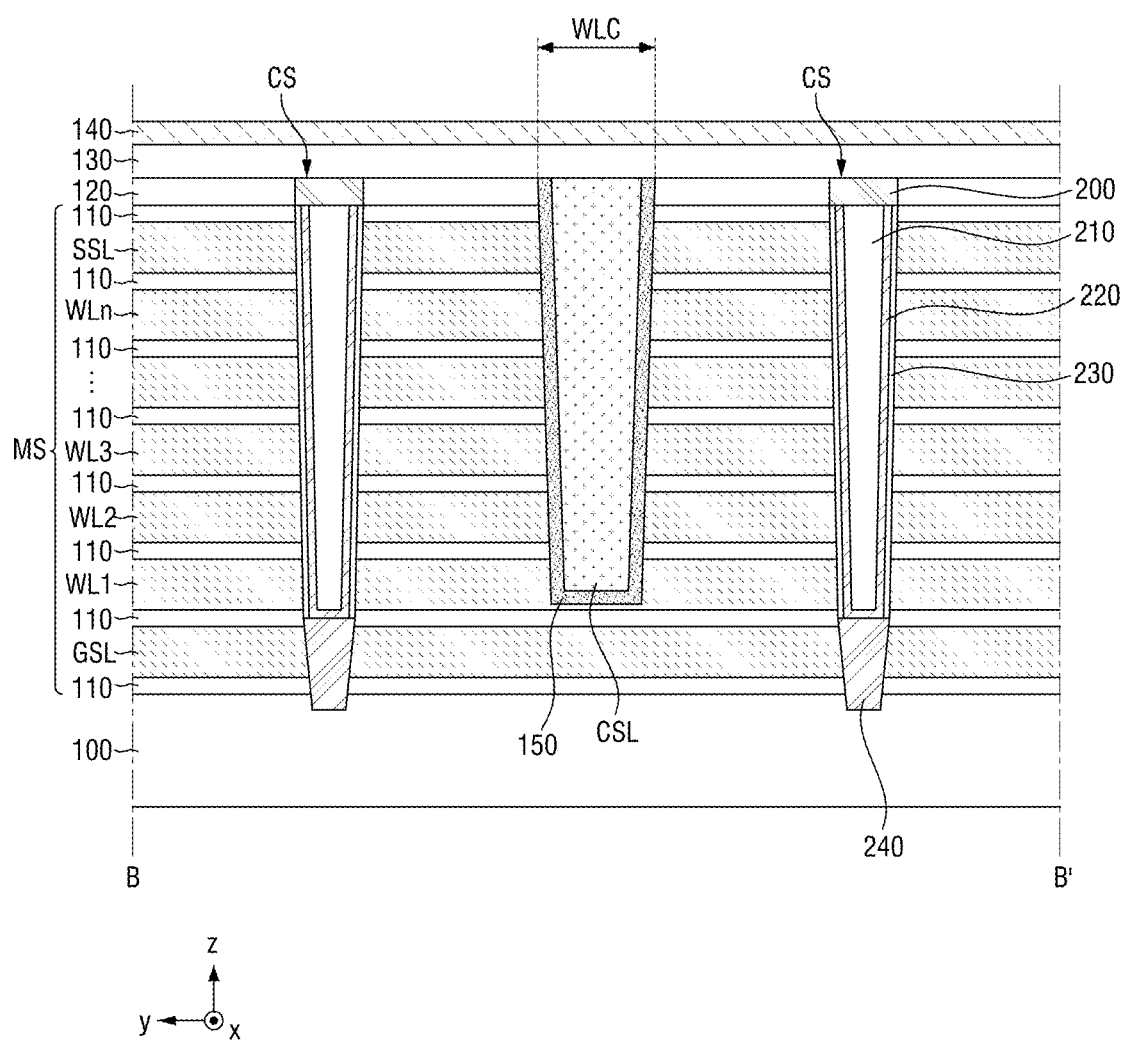
FIGS. 25 and 26 are other example cross-sectional views taken along a line B-B' of FIG. 7 according to some embodiments.
Figure 26:
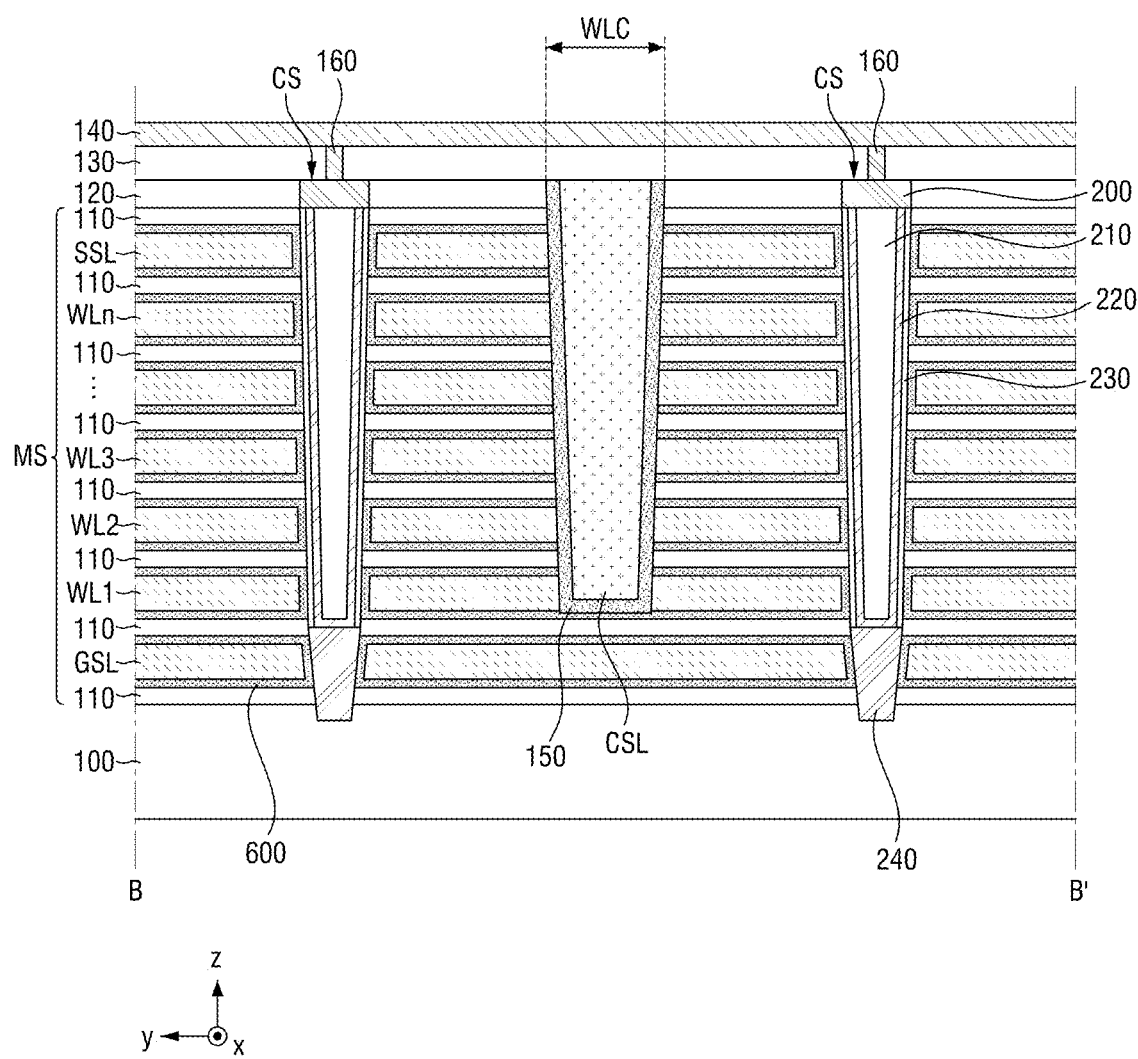
Figure 27:
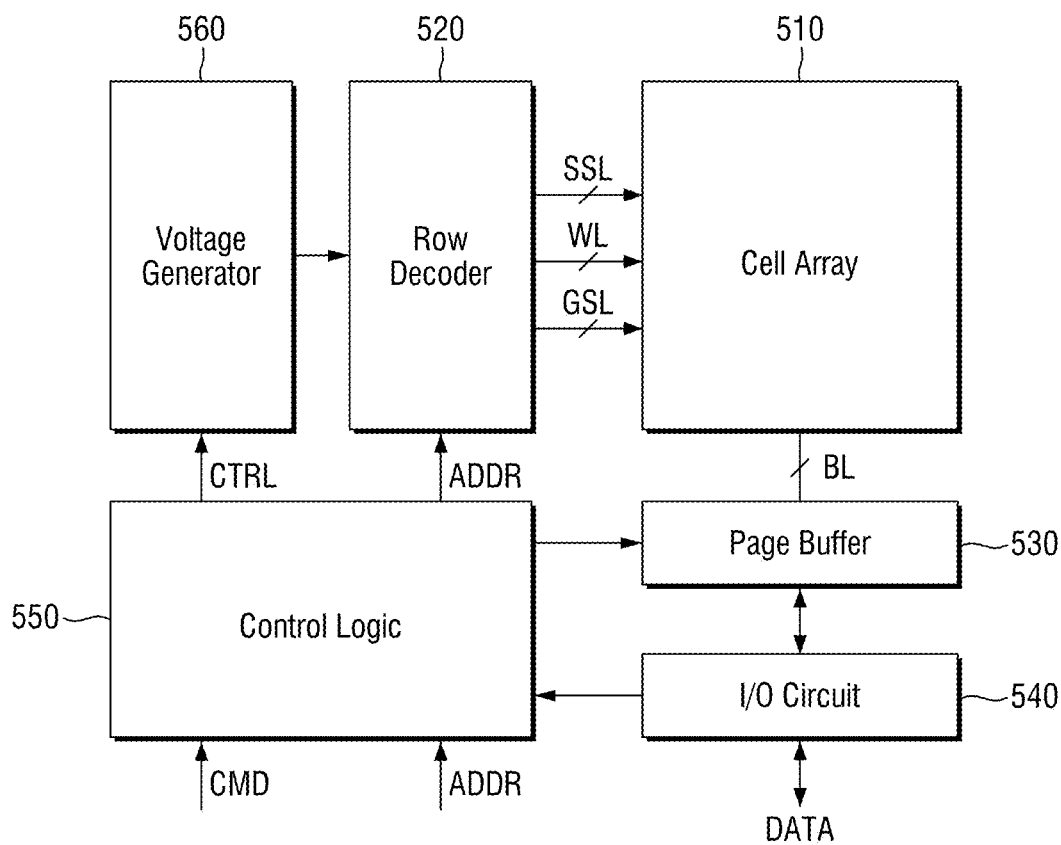
FIG. 27 is an example block diagram for explaining a memory device including a nonvolatile memory device according to some embodiments.

FIGS. 25 and 26 are other example cross-sectional views taken along a line B-B' of FIG. 7 according to some embodiments. FIG. 27 is an example block diagram for explaining a memory device including a nonvolatile memory device according to some embodiments.

Referring to FIGS. 25 and 27, a nonvolatile memory device system 5 including the nonvolatile memory device according to some embodiments may include a cell array 510, a row decoder 520, a page buffer 530, an input/output circuit 540, a control logic 550, and a voltage generator 560 including the nonvolatile memory device according to some embodiments.

The cell array 510 may be connected to the row decoder 520 through the word lines WL, the string selection lines SSL and the ground selection line GSL. Further, the cell array 510 may be connected to the page buffer 530 through the bit lines BL. Further, the cell array 510 may include a nonvolatile memory device according to some embodiments explained in FIGS. 6 and 7. The row decoder 520 may select one of the memory blocks of the cell array 510 in response to the address ADDR. The row decoder 520 may select one of the word lines WL of the selected memory block. The row decoder 520 may transfer a word line voltage to the word line of the selected memory block.

The page buffer 530 may operate as a writing driver or a detection amplifier depending on the operation mode. At the time of the program operation, the page buffer 530 may transfer a bit line voltage corresponding to data to be programmed to the bit line of the cell array 510. At the time of the read operation, the page buffer 530 may detect data stored in a selected memory cell through the bit line. The page buffer 530 may make the bit line BL float. The page buffer 530 may include a plurality of pad electrodes (not shown) that are electrically connected to a plurality of channel structures in the cell array 510 to provide a voltage.

The input/output circuit 540 may transfer the write data to be input at the time of the program operation to the page buffer 530. The input/output circuit 540 may output read data DATA provided from the page buffer 530 to the outside at the time of the read operation. The input/output circuit 540 may transfer the input address or command to the control logic 550. The control logic 550 may control the page buffer 530 and the row decoder 520 in response to an externally transmitted command CMD. The control logic 550 may control the page buffer 530, the voltage generator 560 and the like to access the selected memory cells in response to the externally provided command CMD. The voltage generator 560 may generate various types of word line voltages to be supplied to each word line WL, and a voltage to be supplied to a bulk (e.g., a well region) in which memory cells are formed, in accordance with the control of the control logic 550.

At this time, the common source line CSL of the nonvolatile memory device according to some embodiments in the cell array 510 may be formed apart from the substrate 100 in the third direction Z as shown in FIG. 25.

In some embodiments of the nonvolatile memory device according to some embodiments adjacent to the page buffer 530, the plurality of channel structures CS may include a dummy region which is not connected to the bit line 140. When forming the word line cut region WLC in the dummy region to be in contact with the substrate 100 as shown in FIG. 8, there may be a high possibility that defects may occur in a plurality of gate electrodes (e.g., the ground selection lines GSLa and GSLb, the plurality of word lines WL1a to WLna and WL1b to WLnb or the string selection lines SSLa and SSLb). In some embodiments of the nonvolatile memory device according to some embodiments adjacent to the page buffer 530, in the dummy region in which the plurality of channel structures CS is not connected to the bit line 140, by forming the word line cut region WLC apart from the substrate 100 in the third direction Z as shown in FIG. 25, it is possible to reduce the possibility of occurrence of defects.

Referring to FIG. 26, unlike the nonvolatile memory device of FIG. 25 according to some embodiments, blocking insulating films 600 which surround some of the upper surfaces, the lower surfaces and the sidewalls of plurality of gate electrodes (e.g., the ground selection lines GSLa and GSLb, the plurality of word lines WL1a to Wlna and WL1b to WLnb or the string selection lines SSLa and SSLb) may be further included. Since the explanation related to the blocking insulating film 600 is the same as the explanation in FIG. 10, the explanation will not be provided.

Figure 28:
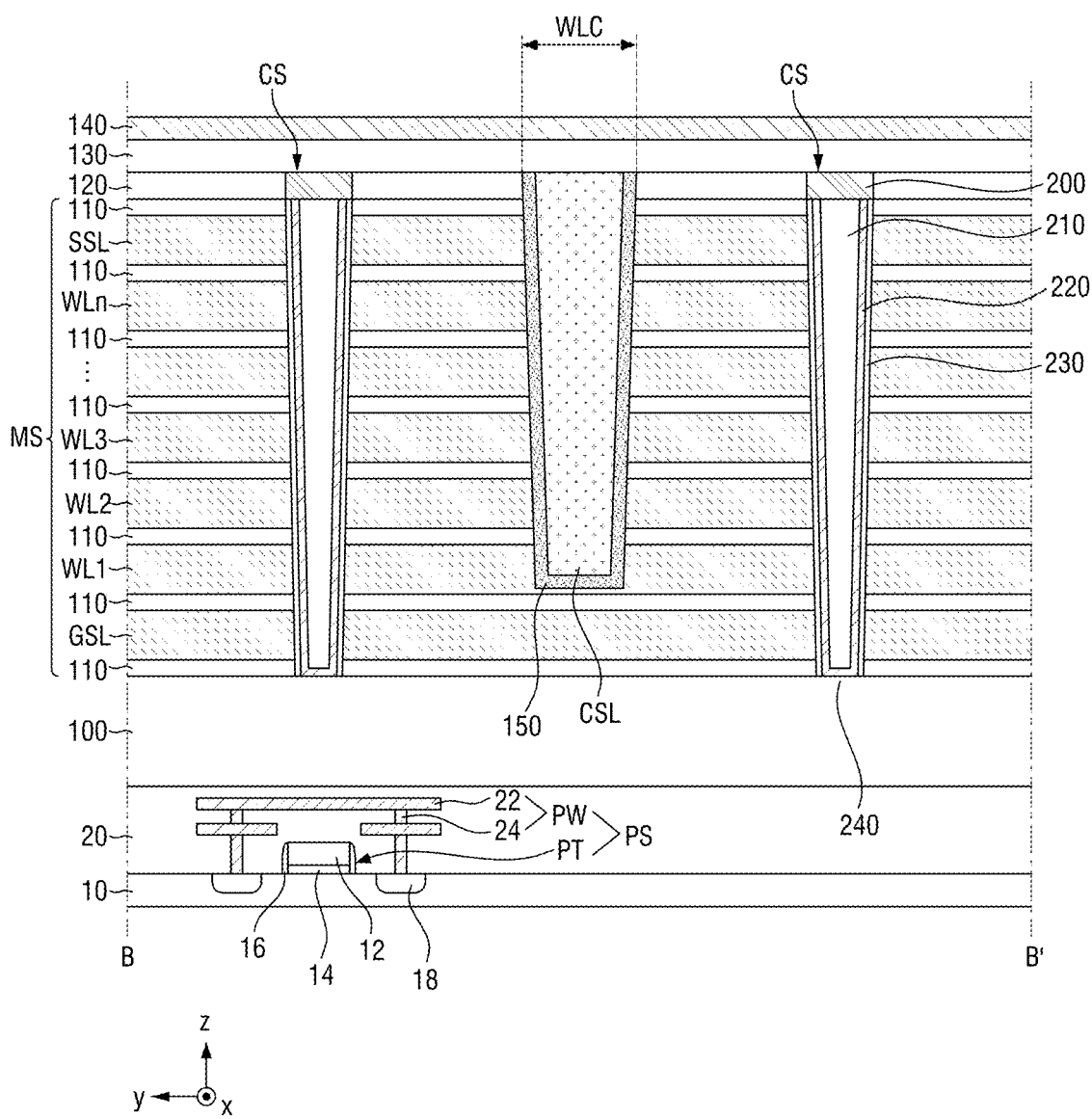
FIG. 28 is another example cross-sectional view taken along the line B-B' of FIG. 7.

FIG. 28 is another example cross-sectional view taken along the line B-B' of FIG. 7.

Referring to FIG. 28, unlike FIG. 27, a COP structure is provided. In the explanation of the COP structure, repeated contents of explanation of FIGS. 23 and 25 will be omitted.

The peripheral circuit structure PS according to some embodiments may include a cell array 510, a row decoder 520, a page buffer 530, an input/output circuit 540, a control logic 550, and a voltage generator 560 including the nonvolatile memory device according to some embodiments explained above in FIG. 27.

In concluding the detailed description, those skilled in the art will appreciate that many variations and modifications may be made to the preferred embodiments without substantially departing from the principles of the present inventive concepts. Therefore, the disclosed preferred embodiments of the present inventive concepts are used in a generic and descriptive sense only and not for purposes of limitation.

What is claimed is:

1. A nonvolatile memory device comprising:
   a substrate;
   a mold structure including a first insulating pattern and a plurality of gate electrodes alternately stacked in a first direction on the substrate; and
   a word line cut region which extends in a second direction different from the first direction and cuts the mold structure,
   wherein the word line cut region includes a common source line and source line spacer, and
   the common source line includes a common source line insulating pattern extending in the second direction in an extension region of the mold structure, and a conductive pattern extending in the second direction in a cell array region of the mold structure, the conductive pattern being in contact with the common source line insulating pattern and a cross-section in the second direction.

2. The nonvolatile memory device of claim 1, wherein the common source line insulating pattern includes a first sub-insulating pattern and a second sub-insulating pattern spaced apart in the second direction, and
   a gate electrode of the plurality of gate electrodes, around the first sub-insulating pattern and the second sub-insulating pattern, has an H shape.

3. The nonvolatile memory device of claim 1, wherein the common source line insulating pattern includes an air gap.

4. The nonvolatile memory device of claim 1, wherein a peripheral circuit structure including a peripheral circuit element electrically connected to the mold structure is below the substrate.

5. The nonvolatile memory device of claim 1, wherein the common source line insulating pattern includes an amorphous carbon layer (ACL).

6. The nonvolatile memory device of claim 1, wherein the common source line insulating pattern includes a spin-on hard mask (SOH).

7. A nonvolatile memory device comprising:
   a substrate;
   a mold structure including a first insulating pattern and a plurality of gate electrodes alternately stacked on the substrate in a first direction;
   a plurality of channel structures penetrating the mold structure;
   a plurality of pad electrodes which is electrically connected to the plurality of channel structures to provide a voltage; and
   a plurality of word line cut regions which extends in a second direction different from the first direction and cuts the mold structure,
   wherein each of the plurality of word line cut regions includes a common source line,
   each of the common source lines includes a second insulating pattern extending in the second direction, and a conductive pattern extending in the second direction and being in contact with the second insulating pattern and a cross-section in the second direction, and
   a lowermost part in the first direction of at least one of the common source lines is spaced apart from a gate electrode stacked at a lowermost part in the first direction of the plurality of gate electrodes in the first direction.

8. The nonvolatile memory device of claim 7, the mold structure includes a cell array region, and an extension region having a staircase structure,
   the second insulating pattern is in the extension region of the mold structure.

9. The nonvolatile memory device of claim 8, wherein the cell array region of the mold structure is in the conductive pattern.

10. The nonvolatile memory device of claim 7, wherein the second insulating pattern includes a first sub-insulating pattern and a second sub-insulating pattern spaced apart in the second direction, and
    the gate electrode around the first sub-insulating pattern and the second sub-insulating pattern has an H shape.

11. The nonvolatile memory device of claim 7, wherein the second insulating pattern includes an air gap.

12. The nonvolatile memory device of claim 7, wherein the second insulating pattern includes an amorphous carbon layer.

13. The nonvolatile memory device of claim 7, wherein the second insulating pattern includes a spin-on hard mask.

14. The nonvolatile memory device of claim 7, wherein at least one of the common source lines is adjacent to the plurality of pad electrodes.

15. A nonvolatile memory device comprising:
    a substrate;
    a mold structure including a first insulating pattern and a plurality of gate electrodes alternately stacked on the substrate in a first direction;
    a plurality of channel structures penetrating the mold structure, each of the plurality of channel structures including, at a lowermost stage, a first semiconductor pattern, an information storage film for exposing the first semiconductor pattern, a second semiconductor pattern along the information storage film and the first semiconductor pattern, a filling pattern in the second semiconductor pattern, and a channel pad on the information storage film, the second semiconductor pattern, and the filling pattern;
    a word line cut region which extends along a second direction different from the first direction and cuts the mold structure, the word line cut region including a common source line spacer which is along a sidewall of the word line cut region and exposes the substrate, and a common source line inside the common source line spacer, the common source line including a second insulating pattern extending in the second direction, and a conductive pattern extending in the second direction and being in contact with the second insulating pattern and a cross-section in the second direction;
    a first interlayer insulating film which is on the mold structure and surrounds at least some of the plurality of channel structures and at least a part of the word line cut region;
    a bit line contact on the channel pad;
    a second interlayer insulating film which surrounds the bit line contact; and
    a bit line formed on the second interlayer insulating film and electrically connected to the bit line contact.

16. The nonvolatile memory device of claim 15, wherein the second insulating pattern includes an air gap.

17. The nonvolatile memory device of claim 15, wherein the second insulating pattern includes an amorphous carbon layer.

18. The nonvolatile memory device of claim 15, wherein the second insulating pattern includes a spin-on hard mask.

* * * * *